United States Patent
McClellan

(10) Patent No.: US 7,133,425 B2
(45) Date of Patent: Nov. 7, 2006

(54) COMMUNICATION SYSTEM

(75) Inventor: Brett Anthony McClellan, Laguna Hills, CA (US)

(73) Assignee: SolarFlare Communications, Inc., Irvine, CA (US)

( * ) Notice: Subject to any disclaimer, the term of this patent is extended or adjusted under 35 U.S.C. 154(b) by 1071 days.

(21) Appl. No.: 10/194,775

(22) Filed: Jul. 10, 2002

(65) Prior Publication Data

US 2004/0008737 A1   Jan. 15, 2004

(51) Int. Cl.
    *H04J 3/04* (2006.01)
(52) U.S. Cl. ............... 370/535; 370/477; 375/222
(58) Field of Classification Search ........... 370/232, 370/535, 477; 375/267, 220–222
    See application file for complete search history.

(56) References Cited

U.S. PATENT DOCUMENTS

| | | | |
|---|---|---|---|
| 4,359,778 A | 11/1982 | Lee | 375/231 |
| 4,583,235 A | 4/1986 | Dömer et al. | 375/229 |
| 4,956,838 A | 9/1990 | Gilloire et al. | 370/291 |
| 5,222,084 A | 6/1993 | Takahashi | 370/290 |
| 5,305,307 A | 4/1994 | Chu | 370/288 |
| 5,633,863 A | 5/1997 | Gysel et al. | 370/290 |
| 5,646,958 A | 7/1997 | Tsujimoto | 375/233 |
| 5,856,970 A | 1/1999 | Gee et al. | 370/286 |
| 5,896,452 A | 4/1999 | Yip et al. | 379/406.01 |
| 5,903,546 A * | 5/1999 | Ikeda et al. | 370/232 |
| 6,147,979 A | 11/2000 | Michel et al. | 370/292 |
| 6,160,790 A | 12/2000 | Bremer | 370/201 |
| 6,167,082 A | 12/2000 | Ling et al. | 375/233 |
| 6,201,831 B1 | 3/2001 | Agazzi et al. | 375/229 |
| 6,226,332 B1 | 5/2001 | Agazzi et al. | 375/288 |
| 6,249,544 B1 | 6/2001 | Azazzi et al. | 375/233 |
| 6,252,904 B1 | 6/2001 | Agazzi et al. | 375/233 |
| 6,272,173 B1 | 8/2001 | Hatamian | 375/229 |
| 6,285,653 B1 | 9/2001 | Koeman et al. | 320/201 |
| 6,297,647 B1 | 10/2001 | Kirk et al. | 324/628 |
| 6,304,598 B1 | 10/2001 | Agazzi et al. | 375/232 |
| 6,351,531 B1 | 2/2002 | Tahernezhaadi et al. | 379/406.01 |
| 6,356,555 B1 | 3/2002 | Rakib et al. | 370/441 |
| 6,433,558 B1 | 8/2002 | Sciacero et al. | 324/628 |
| 6,463,041 B1 | 10/2002 | Agazzi | 370/286 |
| 6,480,532 B1 | 11/2002 | Vareljian | 375/222 |
| 6,493,448 B1 | 12/2002 | Mann et al. | 379/406.01 |
| 6,584,160 B1 | 6/2003 | Amrany et al. | 375/296 |
| 6,618,480 B1 | 9/2003 | Polley et al. | 379/406.05 |
| 6,665,402 B1 | 12/2003 | Yue et al. | 379/406.04 |
| 2001/0036160 A1 | 11/2001 | Curran et al. | 370/290 |
| 2002/0067824 A1 | 6/2002 | Wang | 379/406.06 |
| 2002/0106016 A1 | 8/2002 | Egelmeers et al. | 375/232 |
| 2002/0191552 A1 | 12/2002 | Watkinson | 370/286 |
| 2003/0067888 A1 | 4/2003 | Bina et al. | 370/286 |
| 2005/0157811 A1* | 7/2005 | Bjerke et al. | 375/267 |

OTHER PUBLICATIONS

"Producing a Counter EMF", http://www.tpub.com/neets/book2/5c.htm. 3 pages (date unknown).

(Continued)

*Primary Examiner*—John Pezzlo
(74) *Attorney, Agent, or Firm*—Weide & Miller, Ltd.

(57) ABSTRACT

A method and apparatus is disclosed for facilitating high-speed data communication. In one embodiment a receiver is configured to include error correction coding in an interleaved environment to increase data transmission rates. In one embodiment the signal mapping scheme includes constellation shaping to reduce transmit power levels. In one embodiment 8-state Ungerboeck trellis coding is implemented with 4-dimensional PAM10 signal mapping.

28 Claims, 13 Drawing Sheets

OTHER PUBLICATIONS

"Electric Machinery: Chap. 2 Transformers—Dot Convention to Denote the Polarity of a Transformer", http://pemclab.cn.netu.edu.tw/W3elemac/W3slide.ch2.xformer/sld009.htm (date unknown).

"Transformer Polarity", Copyright 2002 Kilowatt Classroom, 11C, 1 page (date unknown).

"Application Note—Design of H.F. Wideband Power Transformers; Part II—EC07213", Philips Semiconductors, pp. 1-10, March 23, 1998.

"Technical Information—Use of Ferrites in Broadband Transformers", Fair-Rite Products, Corp., 14th Edition, pp. 170-173 (date unknown).

Peter Kabal, et al., "Partial-Response Signaling", *IEEE Transactions on Communications*, vol. COM-23, No. 9, Sep. 1975, pp. 921-934.

Huiting Chen, et al. "Current Mirror Circuit with Accurate Mirror Gain for Low β Transistors", supported in part by Dallas Semiconductor Corp., 4 pages, (date unknown).

M. Tomlinson, "New Automatic Equaliser Employing Modulo Arithmetic", *Electronic Letters*, vol. 7, Nos. 5/6, Mar. 25, 1971, pp. 138-139.

Robert F. H. Fischer, et al., "Dynamics Limited Precoding, Shaping, and Blind Equalization for Fast Digital Transmission over Twisted Pair Lines", *IEEE Journal on Selected Areas in Communications*, vol. 13, No. 9, Dec. 1995, pp. 1622-1633.

Robert F. H. Fischer, et al., "Comparison of Precoding Schemes for Digital Subscriber Lines", *IEEE Transactions on Communications*, vol. 45, No. 3, Mar. 1977, pp. 334-343.

Hiroshi Harashima, et al., "Matched-Transmission Technique for Channels with Intersymbol Interference", *IEEE Transactions on Communications*, vol. COM-20, No. 4, pp. 774-780, Aug. 1972.

A. Hekersdorf, et al., "A Scalable SDH/SONET Framer Architecture for DATACOM and TELCO Applications", IBM Research, Zurich Research Laboratory, Switzerland, 8 pages (date unknown).

"Gigabit Ethernet Over Category 5", Copyright 2000-2001 Agilent Technologies, 12 pages.

Christopher T. DiMinico of Cable Design Technologies (CDT) Corporation, Massachusetts and Paul Kish of NORDX/CDT, Montreal Canada, "Development of Equal Level Far-End Crosstalk (ELFEXT) and Return Loss Specifications for Gigabit Ethernet Operation on Category 5 Copper Cabling", 10 pages (date unknown).

M.P. Sellers, et al., "Stabilized Precoder for Indoor Radio Communications", *IEEE Communications Letters*, vol. 4, No. 10, Oct. 2000, pp. 315-317.

"Wirescope 350—Understanding ELFEXT", © 2000 Agilent Technologies, 2 pages (date unknown).

Pedro Silva, et al., "Precoder Circuit for Channels with Multipath Dispersion", Telecommunications Institute, Department of Electronics and Telecommunications Engineering, The University of Aveiro—University Campus, Portugal, 4 pages (date unknown).

David Crawford, "Adaptive Filters", © David Crawford 1996, pp. 1-5.

"Tutorial: Adaptive Filter, Acoustic Echo Canceller, and its Low Power Implementation", © of Freehand Communications AB, 6 pages (date unknown).

David A. Johns, et al., "Integrated Circuits for Data Transmission Over Twisted-Pair Channels", *IEEE Journal of Solid-State Circuits*, vol. 32, No. 3, Mar. 1997, pp. 398-406.

Prof. David Johns, University of Toronto, "Equalization", © D.A. Johns 1997, 29 pages.

Shao-Po Wu, et al., "FIR Filter Design via Semidefinite Programming and Spectral Factorization", Information Systems Laboratory, Stanford University, CA, 6 pages (date unknown).

David Smalley, "Equalization Concepts: A Tutorial", Atlanta Regional Technology Center, Texas Instruments, pp. 1-29, Oct. 1994.

Shao-Po Wu, et al., "FIR Filter Design via Spectral Factorization and Convex Optimization", to appear as Chapter 1 of *Applied Computational Control, Signal and Communications*, Biswa Datta Editor, Birkhauser, 1977, pp. 1-33.

Richard D. Wesel, et al., "Achievable Rates for Tomlinson-Harashima Precoding", *IEEE Transactions on Information Theory*, vol. 44, No. 2, Mar. 1998, pp. 824-831.

Wolfgang H. Gerstacker, et al., "Blind Equalization Techniques for xDSL Using Channel Coding and Precoding", submitted to AEÜ Int. J. Electr. Commun., pp. 1-4, May 1999.

J. Jezek, Institute of Information Theory and Automation, Prague, Czech Republic, et al., "New Algorithm for Spectral Factorization and its Practical Application", pp. 1-6 (date unknown).

Chip Fleming, "A Tutorial on Convolutional Coding with Viterbi Decoding", © 1999-2002, Spectrum Applications, pp. 1-6.

"ADSL Tutorial", http://www.dslforum.org/aboutdsl/adsl_tutorial.html. pp. 1-3 (date unknown).

"Introduction to DSP", http://www.bores.com/courses/intro/filters/4_fir.htm, pp. 1-2 (Date Unknown).

"QAM_VR—QAM Demodulator with Variable Rate", DesignObjects™ by sci-worx,, pp. 1-2 (date unknown).

Description of Algorithms (Part 1), http://pw1.netcom.com/~chip.f/viterbi/algrthms.html. pp. 1-7 (date unknown).

"ELFEXT—Introduction", Fluke Networks™, © 2000, pp. 1-2 (Date Unknown).

"Fast Fourier Transform", http://cas.ensmp.fr/~chaplais/Wavetour_presentation/transformees/Fourier/FFTUS.html, pp. 1-2 (Date Unknown).

"Continuous Time Aperiodic Signals: The Fourier Transform", http://ccc.ucsd.edu/~cruz/eec.101//notes/node32.html, pp.1-2, (date unknown).

"Convolution", http://www.wam.umd.edu/~toh/spectrum/Convolution.html, pp. 1-2 (date unknown).

"Convolution by DFT", http://www.gresilog.com/english/excommen/doc/convtd.htm. pp. 1-3 (Date Unknown).

"Iowegian's dspGuru FIR FAQ Part 2: Properties", © 1999-2000 Iowegian International Corp., pp. 1-4.

"28.5 Protocol Implementation Conformance Statement (PICS) Proforma for Clause 28, Physical Layer Link Signaling for 10 Mb/s, 100 Mb/s and *1000 Mb/s* Auto-Negotiation on Twisted Pair", *IEEE Std. 802.3*, 1998 Edition, pp. 6-14 and 18-44.

Jaime E. Kardontchik, 4D Encoding in Leval-One's Proposal for 1000Base-T, Aug. 21, 1997, pp. 1-24.

Gottfried Ungerboeck, Trellis-Coded Modulation with Redundant Signal Sets Part 1: Introduction, IEEE Communications Magazine, Feb. 1987, pp. 5-21.

Oscar Agazzi, Nambi Seshadri, Gottfried Ungerboeck, 10Gb/s PMD Using PAM-5 Trellis Coded Modulation, Mar. 6-10, 2000, pp. 1-38.

R. F. H. Fischer and J. B. Huber, "Comparison of precoding schemes for digital subscriber lines," *IEEE Transactions on Communications*, vol. 45, pp. 334-343, Mar. 1997.

M. Hatamian et al., "Design considerations for Gigabit Ethernet 1000BASE-T twisted pair transceivers," in *Proceedings IEEE Custom Integrated Circuits Conference*, Santa Clara, CA, May 1998, pp. 335-342.

E. F. Haratsch and K. Azadet, "A 1-Gb/s Joint equalizer and trellis decoder for 1000BASE-T Gigabit Ethernet," *IEEE Journal of Solid-State Circuits*, vol. 36, pp. 374-384, Mar. 2001.

\* cited by examiner

COMMUNICATION SYSTEM

FIELD OF THE INVENTION

The invention relates to communication systems and in particular to a method and apparatus for data encoding and decoding.

RELATED ART

Demand for high rate data transmission continues to increase in response to new service offerings and expanded communication network usage, such as for home and business tasks. For example, audio and video content is growing in popularity and is generally bandwidth intensive. In addition, many tasks are now commonly handled via a computer network, such as ordering business supplies, exchanging documents, and information gathering. Moreover, bandwidth demand placed upon a company's local area network is increasing. Often networks are being burdened with more users and larger and more complex software applications. These applications are bandwidth intensive and the complex software applications create larger files. Although many networks are currently at bandwidth capacity additional demands are continually being placed on these network.

While there are numerous proposed solutions to alleviate network congestion by increasing network speeds, many of these proposed solutions require migration to a different communication standard or a different communication medium than is currently in use. While different communication standards (SONET, ATM) and different communication mediums (fiber optic cable, coaxial cable) may make it possible to increase data rates, the cost associated with migration is extremely prohibitive. For example, installation of an optical network to each computer in a local area network requires significant software and hardware upgrades on each end user's platform and installation of fiber optic cable. The cabling cost alone is tremendous.

Another proposed solution is to increase the transmission rate of existing networks. One widely deployed network standard is Ethernet, which utilizes twisted pairs of copper wires as its transmission medium. Although widely deployed and inexpensive to manufacture, twisted pair copper is bandwidth limited. As a result, data signals transmitted at a high rate over the twisted pair copper, or other medium, are subject to significant levels of distortion and error rates. Upon reception, recovering the transmitted signal may be impossible due to this distortion.

While it is possible to perform signal processing or error correction coding, such prior art attempts have been insufficient to achieve desired data transmission rates with acceptable error rates. For example, some attempts to maximize the throughput and signal to noise margin of the channel through use of integrated circuit systems are simply not possible or feasible with existing semiconductor manufacturing processes.

Previous attempts to achieve these above-mentioned goals have not achieved the desired results, which is high data rate, low error rate, data communication. In general, the prior art attempts may be divided into precoded and non-precoded systems. For example, the Rao reference, (U.S. Pat. No. 6,088,827), proposes a non-precoded system that combines PAM5 with Trellis Coded Modulation at a baud rate appropriate for transmitting an aggregate of 1 Gbps over Category-5E unshielded twisted pair (UTP). However, the solution proposed in the Rao reference suffers from several shortcomings. One such shortcoming is that additional symbols must be added to the packet to terminate the trellis. This however, reduces the data transmission rate. Furthermore, control symbols, such as Start and Terminate are not detected using the proposed trellis decoder, and as a result, the control symbols do not enjoy a coding gain. In addition, the PAM-5 mapping as contemplated by the Rao reference is not balanced and thus requires an additional scrambling technique to create a DC balance on the transmit signal. For these reasons, the method and apparatus proposed by the Rao reference does not overcome the drawbacks of the prior art. Other references, such as the reference entitled "A 1-Gb/s Joint Equalizer and Trellis Decoder for 1000Base-T Gigabit Ethernet" written by Haratsch and Azadet and published in IEEE Journal of Solid State Circuit, vol. 36, No 3, March 2001 proposes implementations of equalizers and decoders based on the Rao reference. These implementations incorporate undesirable levels of complexity and thus may not be possible to implement.

In contrast to non-precoded systems, precoded systems perform some signal processing on the signal at the transmitter prior to transmission to account for inter-symbol interference. Such prior art systems suffer from an undesirable increase in transmit power and require greater dynamic range that offsets any gain achieved by preceding. In response to the drawbacks of other types of preceding, Tomlinson-Harashima (TH) preceding was proposed. The article "Comparison of Precoding Schemes for Digital Subscriber Lines" written by R. Fischer and J. Huber and published in IEEE Transactions on Communications, vol. 45, no. 3 March, 1997 discusses TH preceding. TH precoding implements a non-linear modulo operation to maintain the transmitted signal within a predefined range. This proposed solution undesirably requires a much larger dynamic range at the receiver to handle an extended symbol constellation. In addition, with TH Precoding most of the reduction in transmit power provided by constellation shaping is lost.

Another proposed solution was presented by Agazzi et. al ("10 Gb/s PMD Using PAM-5 Trellis Coded Modulation") in a Broadcom Corp. proposal to IEEE 802.3ae, in Albuquerque, N. Mex. in Mar. 6–10, 2000. However, this proposed solution increases the complexity of the transmit precoder at high data rates.

In addition, these above-described systems do not address the degradation of coding gain from noise correlation created by a channel shortening filter and forward equalizer. The expected coding gains from the Viterbi trellis decoder are based on the assumption of additive white gaussian noise (AWGN). When the noise is correlated (or not white) then the expected coding gain is not realized.

As a result, there is a need for a method and apparatus to facilitate high-speed data transmission while maintaining low error rates that is capable of overcoming the drawbacks of the art.

SUMMARY

A communication system for transmitting data over two or more channels is disclosed that overcomes the drawbacks of the prior art. In one embodiment the communication system comprises a de-multiplexer configured to receive data from a data source on a first number of conductors and output the data on a second number of conductors such that the second number of conductors is greater than the first number of conductors. Also included in this embodiment is one or more error correction encoders configured to receive the data on the second number of conductors and perform encoding on the data to create encoded data. A multiplexer is also provided to process the encoded data from the one or more error correction encoders on the second number of conductors and output the encoded data on a third number of outputs. There also exist one or more mapping modules configured to receive the encoded data from the multiplexer and generate symbol values representative of the encoded data. The symbol values may be selected from a constellation of available symbol values.

In one configuration of this embodiment the system further comprises one or more precoders configured to receive the symbol values and process the symbol values to at least partially compensate for the effects of transmission through a channel. In another configuration the system further includes two or more transmit processing modules configured to transmit the symbol values through two or more transmission lines. The one or more mapping modules may comprise mapping modules configured to perform PAM10 mapping on the data. It is contemplated that the constellation of available symbol values may comprise a constellation of 10,000 data points, 8192 of which are reserved to represent data. Regarding the error correction encoders, 8-state Ungerboeck trellis encoders may be utilized. As one advantage to this system, the one or more mapping modules may map the data into symbol values selected from a constellation of symbol values that have an average level of zero.

In another embodiment a communication system is disclosed for processing at least one signal received over two or more channels. This embodiment comprises one or more equalizers configured to receive one or more signals from the two or more channels and process the one or more signals to reduce the effects of transmission through the two or more channels. The communication system includes a de-multiplexer configured to receive the signal from the one or more equalizers on a first number of inputs and output at least two signals on a second number of outputs. It is contemplated that the second number of outputs is greater than the first number of outputs. Two or more error correction decoders are also included and configured to perform decoding on the two signals thereby creating at least two decoded signal. Further, the system includes a multiplexer configured to combine the at least two decoded signals into at least one decoded signal. The decoded signal is provided to one or more demapping modules configured to translate the decoded signal to data. This is but one possible example embodiment.

In one configuration of this system the de-multiplexer converts four signals into sixteen signals and the multiplexer converts sixteen signals into four signals and the two or more channels comprises four channels and each channel comprises a twisted pair conductor. It is contemplated that the error correction decoders may be configured to decode 8-state Ungerboeck trellis encoded data. The demapping modules may be configured to map 4D PAM10 symbols into data and control symbols and in one embodiment the signal comprises PAM10 symbols. It is further contemplated that the equalizers may comprise a feedforward equalizer and a feedback equalizer.

Also disclosed herein is a method of processing data prior to transmission over one or more channels to increase the data transmission rate. This method comprises receiving a first data stream from a data source and demultiplexing the first data stream into two or more second data streams. Thereafter, the method performs error correction encoding on the two or more second data streams to create two or more encoded data streams and it then multiplexes the two or more encoded data streams to create interleaved encoded data streams. The number of interleaved encoded data streams may be less than the number of non-interleaved encoded data streams. The interleaved encoded data streams may then be modulated to convert the interleaved encoded data streams into symbol values on two or more modulator outputs.

In one configuration the error correction encoding comprises trellis encoding and the step of modulating comprises modulating the one or more encoded data streams using ten level pulse amplitude modulation. The interleaved encoded data stream may be comprised of control codes and data and the step of modulating may translate the data and control codes into symbol values. In one embodiment the symbol values that represent data have an average level of zero. The step of modulating may comprise performing ten value pulse amplitude modulation.

In yet another embodiment a method for processing signals received at a first data rate is provided that comprises the steps of receiving two or more signals via two or more channels and filtering the two or more signals to reduce the effects of intersymbol interference. Thereafter, the method may de-interleave the two or more signals to create three or more signals at a second data rate and then perform error correction processing on the three or more signals to correct errors arising during transmission. Next, the method may interleave the three or more signals to create two or more signals at a third data rate and demodulate the two or more signals to convert the signals to data.

In one variation, the second data rate is lower than the first data rate and the third data rate is higher than the second data rate. The signal may comprise symbol values and the step of demodulating may comprise converting at least one symbol value to data. The step of demodulating may also comprise mapping the two or more signals to data and control codes. It is contemplated that the signal may comprise a symbol value and the demodulating may comprise comparing the signals to a constellation of symbol values to determine if the signals comprise data or a control code. In one embodiment the signal comprises ten level pulse amplitude modulated symbol values.

As a further advantage over the prior art, a method and apparatus for constellation mapping is disclosed that overcomes drawbacks of the prior art. The method and apparatus for constellation mapping disclosed herein provides a constellation, or group, of symbol values that provides a desirable average transmit power level. In embodiment the average value of the symbol values that comprise the available symbols to represent data, control codes, or both is zero. In this manner, use of an additional transmit polarity scrambler may be avoided.

One exemplary system for mapping data and control codes to symbol values operates by receiving a signal and analyzing the signal to determine if the signal comprises a control code or data. In this embodiment the average level of the symbol values reserved for data comprises zero. As a result of the analyzing, this method translates the data to a data symbol value such that the data symbol values are selected from a group of symbol values reserved for data. Also resulting from the analyzing, the method translates control codes to a control code symbol value. The control code symbol values are selected from a group of symbol values reserved for control codes It is contemplated that in one embodiment the two or more inputs comprise four inputs and that the group of symbol values reserved for data comprises 8192 symbol values. In one embodiment the signal comprises binary information. In one exemplary method of operation, the analyzing comprises comparing the signal to a group of signal values reserved for control codes.

In another embodiment, a method is provided for creating a constellation of available symbol values available for mapping data into symbols comprising the steps of determining a total number of data values to be mapped into the constellation and defining a set of symbol values from the constellation reserved for data. This method also includes defining an association between data and a symbol value, such association may be used by a mapper. The average value of the set of symbol values reserved for data may comprise zero.

In one variation this method further comprising defining a set of symbol values from the constellation reserved for control codes. This constellation may comprise 10000 data points and each symbol value may comprise one of ten different levels. In one embodiment the constellation comprises a four dimensional constellation.

Yet another system for mapping data and control codes into symbol values may be provided such that in one embodiment an input is configured to receive data and control codes. The input connects to control logic configured to translate the data and control codes to a symbol value. The control logic may be configured to map a control code to a symbol value reserved for control codes and map data to a symbol value reserved for data. The symbol values reserved for data may be selected to have an average power level of zero.

A system for mapping data is also disclosed that comprises an input configured to receive a signal with a processor connected to the input. The processor is configured to analyze the signal to identify data and control codes, translate the data into symbol values reserved for data, and translate the control codes into symbol values reserved for control codes, such that the symbol values reserved for data have an average level of zero.

Such a system may further comprise a memory accessible by the processor and configured to store symbol values. The symbol values reserved for data may comprise 8192 symbol values. The step of translating the data into a symbol value may comprise translating two or more bits of binary data into a symbol value selected from a group of symbol values reserved for data and having an average value of zero. As discussed below, the symbol values may comprise ten level pulse amplitude modulated symbols.

Upon receipt of the symbol values a method of processing the symbol values may occur. In one embodiment the method comprises receiving a symbol value and analyzing the symbol value. Responsive to the analyzing, a system may convert the symbol value to either two or more bits of data associated with the symbol or a control code associated with the symbol. The group of symbol values that may be associated with the two or more bits of data may have an average value of zero.

In one embodiment the step of analyzing comprises comparing the symbol value to a plurality of symbol values stored in a memory to thereby map the symbol value to either two or more bits of data or a control code. It is contemplated that the step of receiving comprises receiving a symbol value during each clock cycle on each of four channels.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
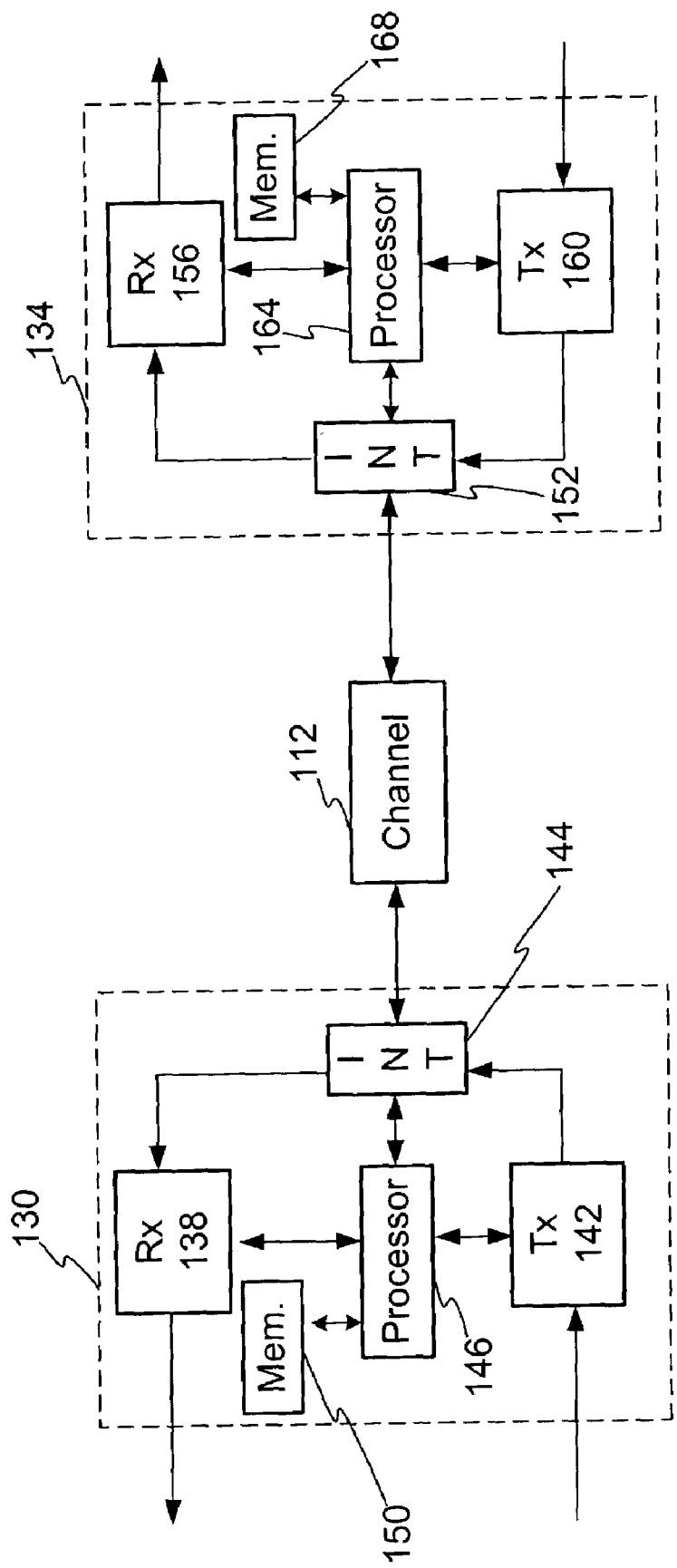
FIG. 1 illustrates a block diagram of an example embodiment of a pair of transceivers configured to communicate over a channel.

In general, the method and apparatus disclosed herein performs data transmission using time interleaved error correction coding in a multi-pair or multi-channel system to achieve data transmission rates and error rates that are better than that achievable by systems of the prior art. In reference to FIG. 1, a block diagram of a receiver/transmitter pair is shown. This is one possible example environment of the method and apparatus disclosed herein. A channel 112 connects a first transceiver 130 to a second transceiver 134. The first transceiver 130 connects to the channel 112 via an interface 144. The interface 144 is configured to isolate the incoming from outgoing signals. In another embodiment the channel 112 may comprises numerous conductors and hence the interface 144 performs isolation and separates the conductors based on direction of data flow to either of a receiver module 138 or a transmitter module 142. The receive module 138 and transmit module 142 may comprise any assembly of hardware, software, or both configured to operate in accordance with the principles described herein.

The receive module 138 and transmit module 142 communicate with a processor 146. The processor 146 may include or communicate with memory 150. The memory 150 may comprise one or more of the following types of memory: RAM, ROM, hard disk drive, flash memory, or EPROM. The processor 146 may be configured to perform one or more calculations or any form of signal analysis. In one embodiment the processor 146 is configured to execute machine readable code stored on the memory 150. The processor 146 may perform additional signal processing tasks as described below.

The second transceiver 134 is configured similarly to the first transceiver 130. The second transceiver 134 comprises an interface 152 connected to a receiver module 156 and a transmitter module 160. The receiver module 156 and a transmitter module 160 communicate with a processor 164, which in turn connects to a memory 168. Operation occurs as described below in more detail.

Figure 2:
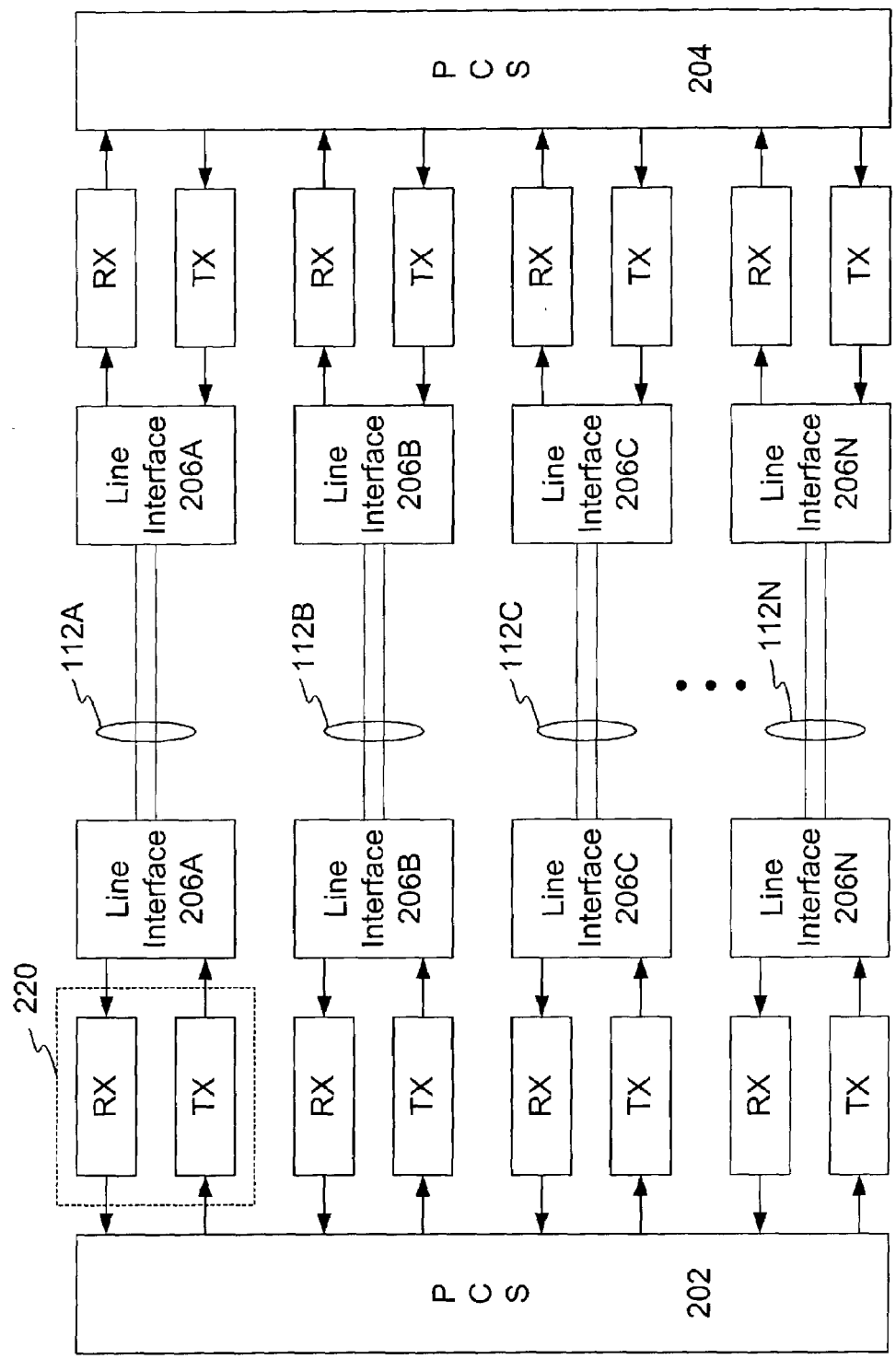
FIG. 2 illustrates a block diagram of a multi-channel point to point communication system.

The communication system illustrated in FIG. 2 is configured as an exemplary multi-channel point-to-point communication system. One exemplary application is a 10 gigabit transceiver utilizing a Category 5 UTP cable supporting Ethernet protocols. As shown it includes a physical coding sublayer 202 and 204, shown as coupled together over a channel 212. In one embodiment each channel comprises twisted pair conductors. Each of the channels 112 is coupled between transceiver blocks 220 through a line interface 206 and each channel is configured to communicate information between transmitter/receiver circuits (transceivers) and the physical coding sublayer (PCS) blocks 202, 204. Any number of channels and associated circuitry may be provided. In one embodiment, the transceivers 220 are capable of full-duplex bi-directional operation. In one embodiment, the transceivers 220 operate at an effective rate of about 2.5 Gigabits per second.

Figure 3:
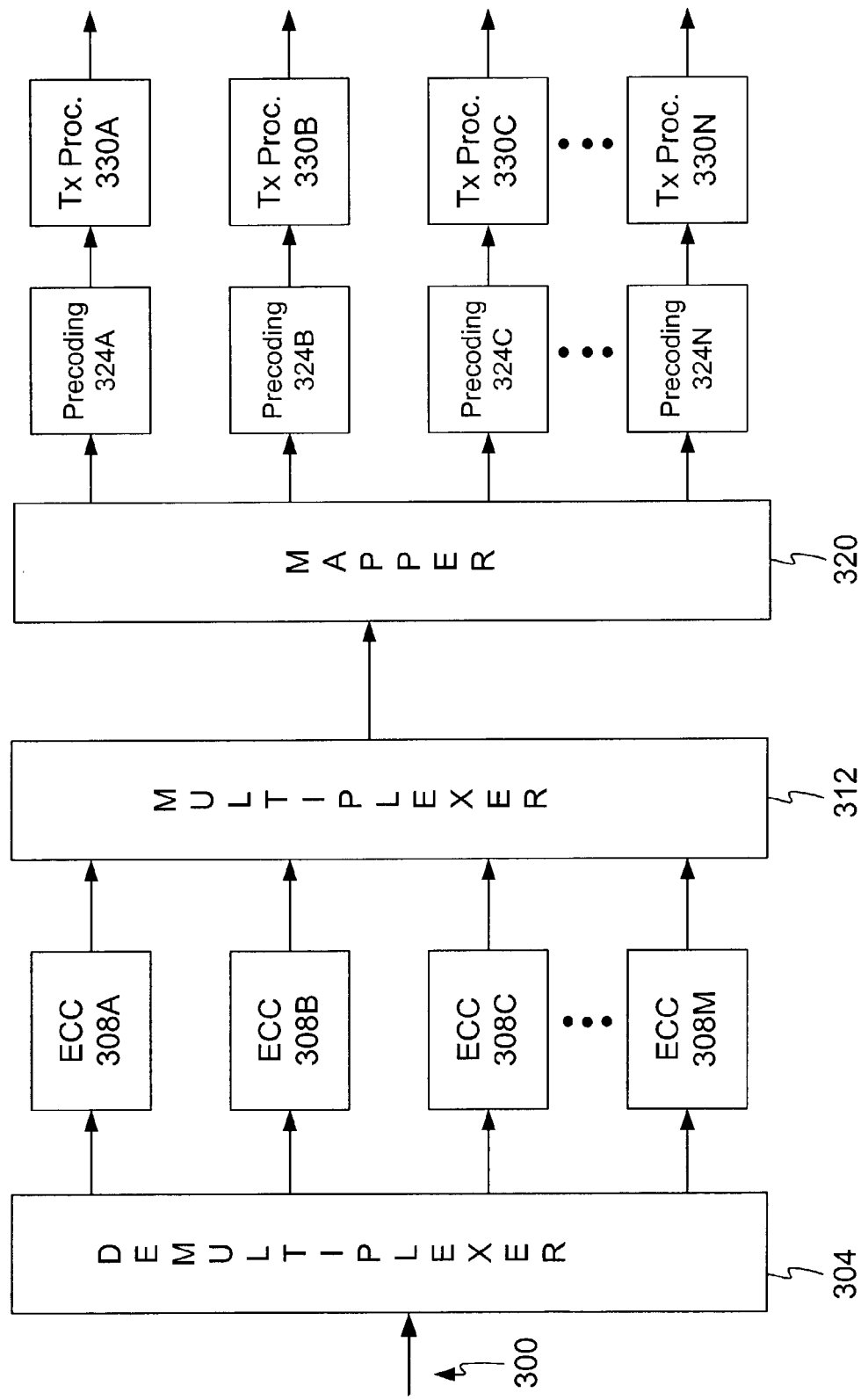
FIG. 3 illustrates a block diagram of an example embodiment of a transmit system configured in accordance with one embodiment of the invention.

FIG. 3 illustrates a block diagram of an example embodiment of a transmit system configured in accordance with the invention. This is but one example embodiment and it is contemplated that one of ordinary skill in the art may enable other embodiments that do not depart from the scope of the invention. As shown, an input 300 from a data source or other component provides data to a de-multiplexer 304. The data source or other component may comprise any source of data, any aspect of the physical coding sublayer, software or hardware interface, multiplexer, or any other device. In one embodiment, the de-multiplexer 304 separates the data from input 300 into several time-interleaved data streams. In one embodiment the de-multiplexer 304 is configured to separate a full rate input data stream at a first data rate into a fractional rate input data stream at a data rate less than the first data rate. Any degree of de-interleaving may occur. It is contemplated that the multiplexer may perform the function of time interleaving or time division multiplexing. In one embodiment the input 300 is configured as a twelve conductor line with each conductor line configured to carry a bit of data during a clocking cycle at a data rate equal 10/12 GHz. In such an embodiment the output of the de-multiplexer 304 outputs four, 12 conductor paths, each of which operate at a data rate of one-fourth 10/12 GHz or 10/48 GHz. These numerical examples are provided for purposes of discussion and not limitation. It is contemplated that the number of fractional rate input data streams output by the de-multiplexer 304 may vary and will depend on the particular design considerations of a particular system.

The output of the de-multiplexer 304 connects to error correction coding (ECC) modules 308A–308M. The ECC modules 308A–308M may perform any type error correction coding as contemplated by one of ordinary skill in the art. In one embodiment the error correction coding performed by modules 308A–308M comprise 8-state Ungerboeck trellis coded modulation. In one embodiment the 8-state Ungerboeck trellis coded modulation is performed on the four interleaved data streams to create a four dimensional (4D) 8-state Ungerboeck trellis coded data stream. The particulars of 4D 8 state Ungerboeck trellis coded modulation are understood by one of ordinary skill in the art and hence are not described in detail herein. In other embodiments the following types of error correction encoding may be performed: trellis coding, convolutional coding, block coding, product coding or any other type of coding.

As an advantage of the system shown in FIG. 3, the processing of the data stream 300 is distributed among each of the ECC modules 308A–308M. By distributing the data amongst several different ECC modules 308A–308M each module is granted more time to perform the required processing before arrival of additional data during a subsequent clock cycle. This reduces the complexity and speed requirements of each ECC module 308A–308M thereby allowing each module to be realized with low-cost standard semiconductor processes. The ECC processing may be distributed between any number of ECC processing modules. As a result of distributing the error correction coding, the process of decoding the data, such as in the receiver, may also be distributed. Decoding is discussed below in more detail. In one embodiment use of 4-way time interleaving of the trellis code allows operation at one-fourth the rate of a non-interleaved system.

The outputs of the ECC modules 308A–308M connect to a multiplexer 312 configured to combine the two or more input signals into a reduced number of outputs. It is contemplated that the inputs to the multiplexer 312 may operate at a lower data rate than the output of the multiplexer.

Figure 4:
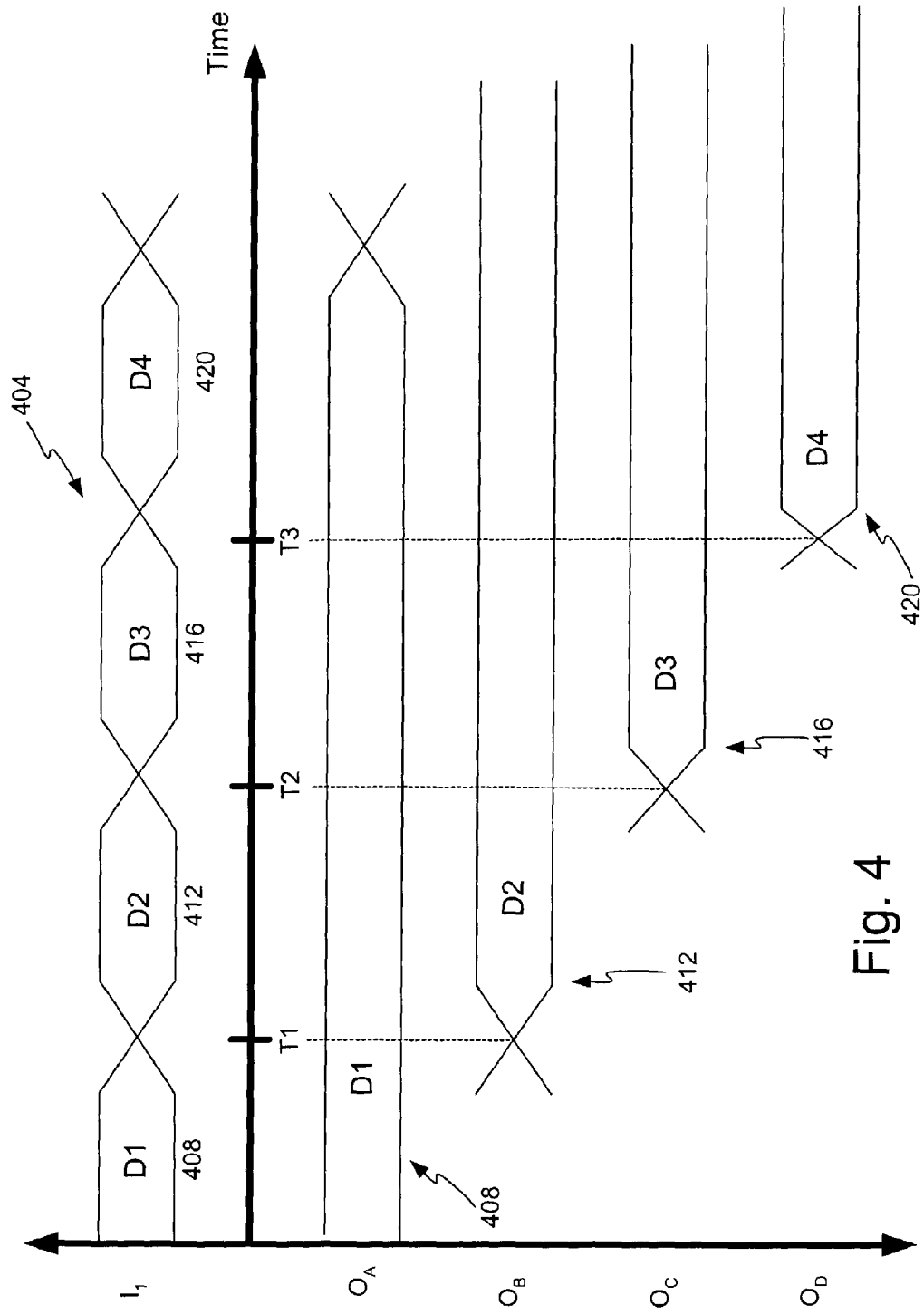
FIG. 4 illustrates an example data stream in a de-interleaved and an interleaved state.

FIG. 4 illustrates an example data stream in a de-interleaved and an interleaved state. An exemplary data stream 404 is comprised of data symbols 408, 412, 416, and 420. In one form of four-way de-interleaving, the input signal 404, shown on the top portion of FIG. 4, is separated into four data streams shown as $O_A$ 408, $O_B$ 412, $O_C$ 416, and $O_D$ 420 located at the bottom portion of the FIG. 4. As a result of the de-interleaving the data rate of each output from the multiplexer is less than the data rate of the input to the de-multiplexer. Thus, at a time T1, the second output 412 begins and continues past a time T2. In a four-way de-interleaving environment the period of each data output may be four times the period of the input 404. This provides the advantage of a lower data rate, i.e. more time, for complex processing operations, such as error correction coding and decoding. Although four-way interleaving is shown, it is contemplated that any degree of interleaving may be achieved with the methods and apparatus shown and claimed herein.

Figure 5:
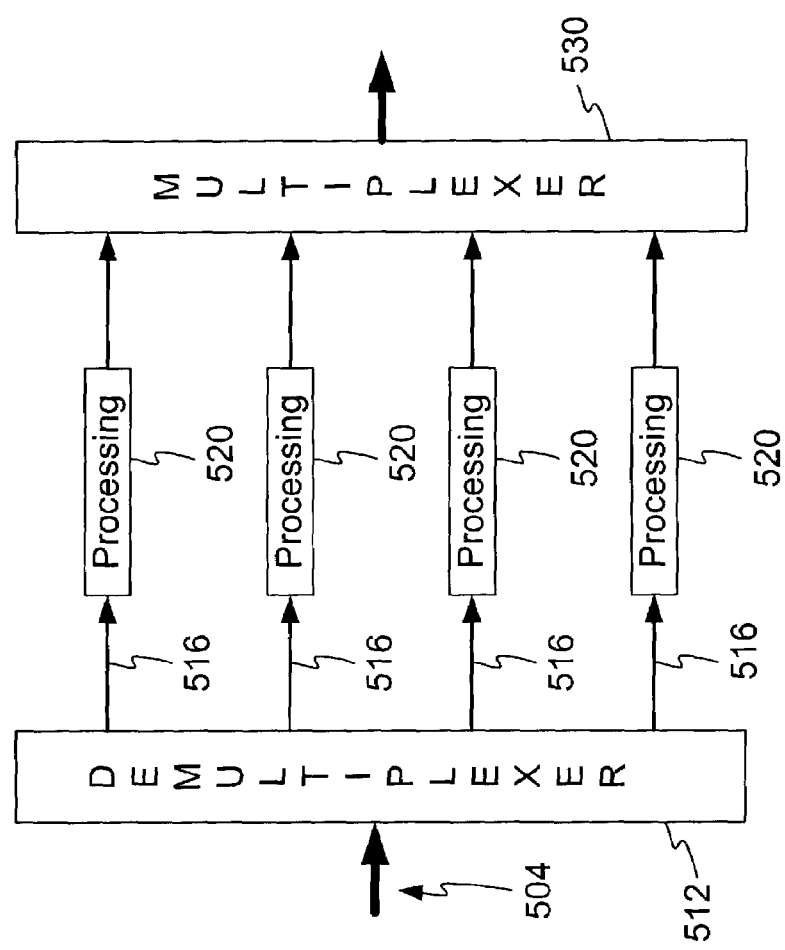
FIG. 5 illustrates a block diagram of an exemplary interleaved system.

FIG. 5 illustrates a more detailed block diagram of a time-interleaved system. As shown, a full rate data stream input 504 connects to a de-multiplexer 512 that separates the data stream into fractional rate data stream outputs 516. In one embodiment the input 504 operates at a data rate of Y MHz while each fractional rate output 516 operates at Y/4 MHz where Y is a non-zero variable.

The output of the de-multiplexer 512 feeds into processing modules 520. The processing modules 520 may comprise any combination of hardware, software, or both configured to performed any type processing as desired. In one embodiment the processing comprises error correction coding, such as 8 state Ungerboeck trellis coded modulation. Similar error correction de-coding may occur at a receiver after de-interleaving. As an advantage to de-interleaving, the data rate is reduced thereby providing more time between subsequently arriving bits or symbols at the processing modules 520. As a result, the processing modules 520 may operate at a lower speed, or may operate at the highest speed possible and operate in parallel to achieve higher overall transceiver operation.

The processing modules 520 provide the processed data to a multiplexer 530. The multiplexer 530 is configured to manipulate the processed data to a reduced number of outputs as shown. Internal operation of de-multiplexer 512 and the multiplexer 530 are known by one of ordinary skill in the art and accordingly are not discussed in detail herein.

Returning now to FIG. 3, the output of the multiplexer 312 connects to a mapper 320. It is contemplated that any number of mappers 320 may be provided, up through N where N is any positive integer value. The mapper 320 is configured to transform or map the arriving data into one or more values, such as symbols. In one embodiment the mapping comprises pulse amplitude modulation (PAM). PAM-type mapping assigns incoming groups of bits to a symbol value. In PAM mapping, a symbol comprises a value that represents one or more bits that are transmitted during a transmit opportunity in place of the one or more bits. In one embodiment, the mapper module 320 performs PAM-10 mapping wherein several bits of data are transformed into a symbol that may assume any one of ten values. Mapping of this nature is known by one of ordinary skill in the art and accordingly is not discussed in detail herein. In one embodiment the mapper 320 performs four-dimensional mapping. As a result, in such an embodiment each mapper 320 outputs four symbols during each clock cycle. It is contemplated that the position of the multiplexer 312 and the mapper 320 may be transposed.

The output of the mapper 320 connects to precoding modules 324A–324N. Although in one embodiment the mapper 320 includes four outputs, each of which feed into a precode module 324, it is contemplated that the precoding operations may be distributed among any number of precode modules, up to N modules, where N is a positive whole number. Precoding may comprise any type signal processing that may occur in the transmitter to counter the effects of the channel. In one embodiment the preceding comprises processing by a finite impulse response filter. Precoding may occur as described a co-pending patent application, entitled Method and Apparatus for Channel Equalization, by inventor William Jones, which was filed on Jul. 1, 2002.

The output of the precoders 324A–324N connect to one or more transmit processing systems 330A–330N. Any number of transmit processing systems 330A–330N may be utilized where N is any positive whole number. Transmit processing comprises processing to facilitate transmission of the signal over one or more channels. The transmit processing systems 330A–330N may comprise line interfaces, amplifiers, transformers, filtering, shaping filters, hybrids, digital to analog converters, and the like as may be desired to facilitate transmission of a signal or data to a remote location.

As an advantage to the configuration shown in FIG. 3, the combined effects of error correction coding, mapping and precoding are combined to reduce error rates while maximizing transmit rates. In addition, the transmit system of FIG. 3 may include constellation shaping within the mapper 320 to provide the advantages discussed below with the discussion of constellation shaping.

Figure 6:
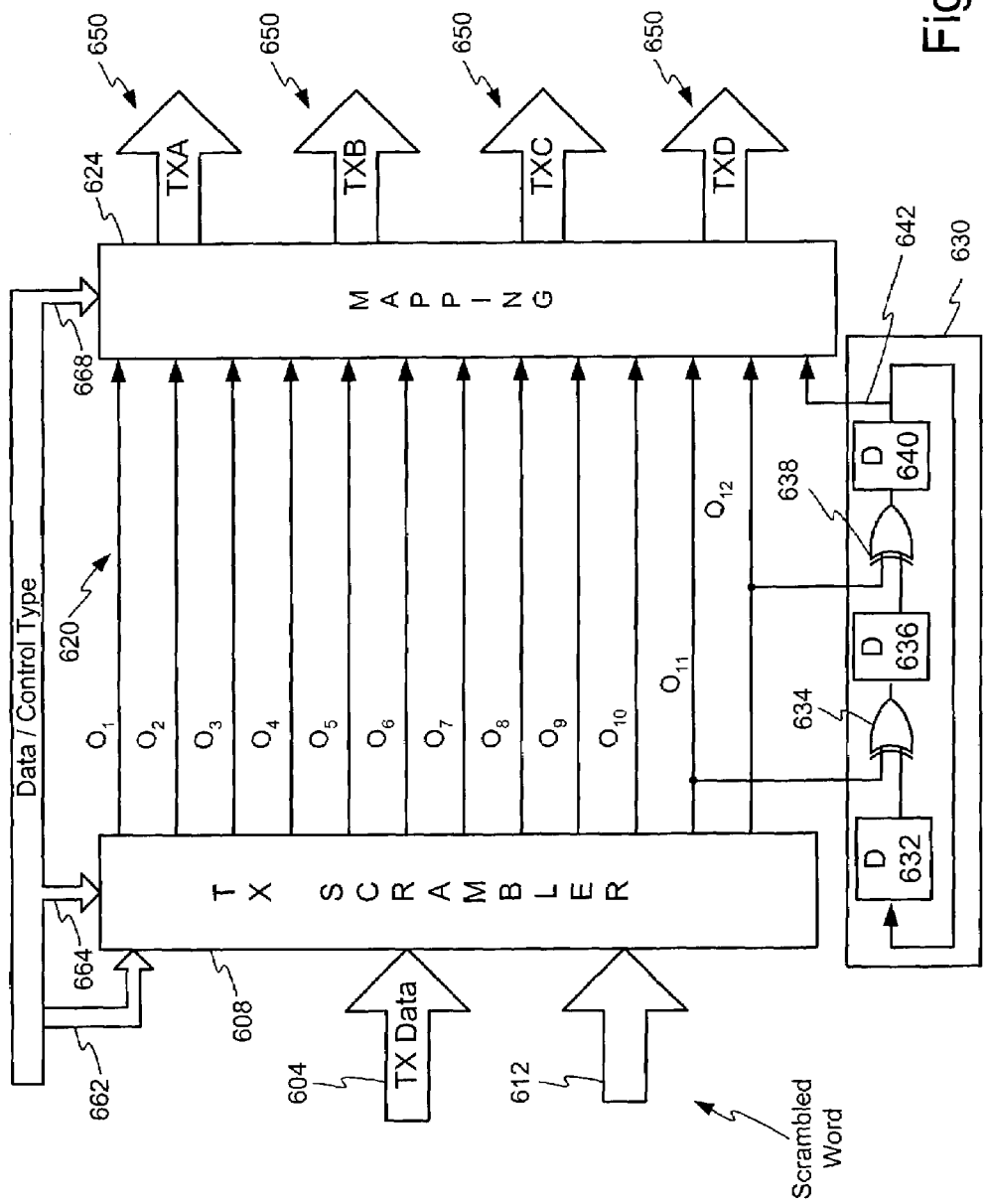
FIG. 6 illustrates a block diagram of an example embodiment of a 4D 8-state trellis encoder with four-dimensional mapping.

FIG. 6 illustrates a more detailed block diagram of an example embodiment of a 4D 8-state trellis encoder with PAM10 mapping. A data input 604 and a scrambler word input 612 connect to the transmit scrambler 608. In one embodiment the data input 604 comprises a 12-bit symbol. In one embodiment the scrambler word on input 612 comprises the output of a linear feedback shift register. In one embodiment the transmit scrambler 608 XOR's the data from input 604 with the scrambler word input 612 to generate scrambled data on outputs 620 which, as shown on outputs $O_1$ through $O_{12}$, feeds into a mapping module 624.

A convolutional encoder 630 connects to output $O_{11}$ and output $O_{12}$ of the scrambler 608 and is configured to provide an input to the mapping module 624. In the exemplary embodiment shown in FIG. 6, the convolutional encoder 630 comprises a first delay element 632 connected in series with a first XOR's logic element 634. The first XOR's logic element 634 also receives as an input the signal on output $O_{11}$. The output of the first XOR's logic element 634 connects in series with a second delay element 636, which in turn connects in series to a second XOR's logic element 638. The second input to the second XOR's logic element 638 is the signal on output $O_{12}$. The output of the second XOR's logic element 638 connects in series to a third delay element to 640, the output of which is provided as an input 642 to the mapping module 624 and as a feedback signal to the first delay 632. In one embodiment the signal on input 642 is a parity bit. Operation of the convolutional encoder 630 is described in the article entitled "Trellis-coded Modulation with Redundant Signal Sets-Part II: State of the Art" as published in IEEE Communications Magazine, Vol. 25, No. 2, February 1987. This article provides a description of one method and apparatus for Trellis coding, and is incorporated by reference in its entirety herein.

The output of the scrambler 608 and the output of the convolutional encoder become a thirteen bit encoder output word that is fed into the mapper 624. In the embodiment shown in FIG. 6, the mapping module 624 performs four dimensional PAM10 mapping to map each 13 bit word into a set of four PAM10 signals, shown on outputs 650. In other embodiments other types of mapping may be performed including but not limited to quadrature amplitude modulation, and any other resolution of baseband or passband modulation mapping.

A data/control code selector input 660 connects to the scrambler 608 and the mapper 624 and carries control information to indicate the type input to the scrambler 608. As an advantage over the prior art, the method and apparatus described herein encodes the control codes as well as the data thereby providing the benefit of encoding to the control codes. To this end, the selector input 660 may be configured to provide the control codes to the scrambler 608 over an input 662. Inputs 664, 668 which also connect to the selector input 660 may provide notice to the scrambler and the mapper 624 that a control code is be provided to the scrambler. In one embodiment the inputs 664, 668 indicate a control code by providing a logical one value to the scrambler 608 and the mapper 624. It is also contemplated that during insertion of a control word, the scrambler may thus disregard the TX data input 604.

Figure 7:
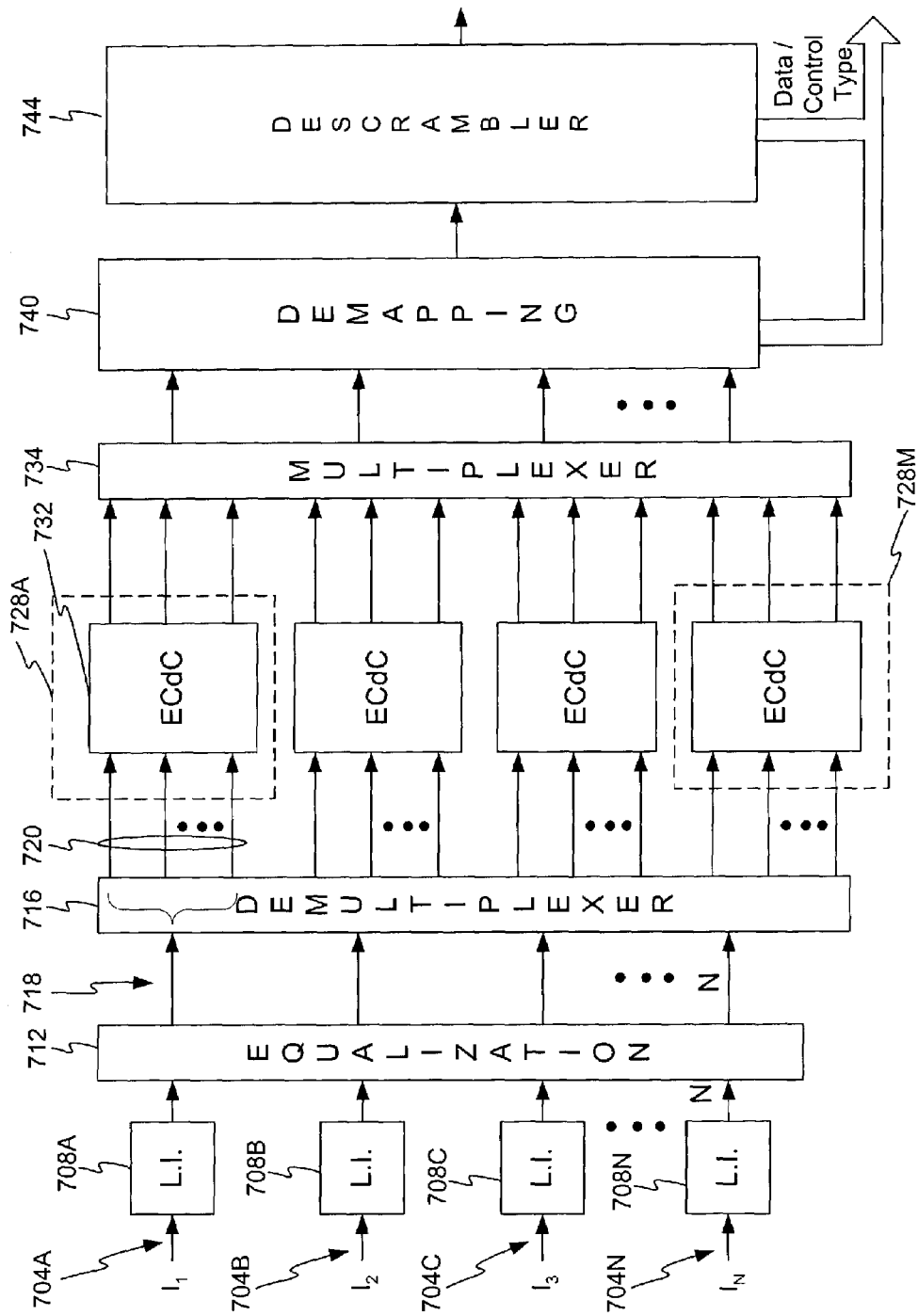
FIG. 7 illustrates a block diagram of an example embodiment of a receiver system configured in accordance with one embodiment of the invention.

FIG. 7 illustrates a block diagram of an example embodiment of a receiver system for use with a transmitter, such as the transmitter shown in FIG. 3. This is but one example embodiment of a receiver. It is contemplated that one of ordinary skill in the art may design other configurations that differ from the exact configuration shown in FIG. 7, but are within the scope of the invention and claims that follow. As shown, inputs $I_1$–$I_N$ receive signals from one or more channels 704. Any number of N inputs may exist where N equals any positive whole number. The inputs 704 connect to line interfaces 708A–708N, where N equals any positive whole number. The line interfaces 708A–708N may comprise any configuration of hardware, software or both configured to receive a signal over one or more channels and process the signal to prepare the signal for subsequent processing. In one embodiment a line interface 708 may comprise amplifiers, filters, and hybrids.

The output of the line interfaces 708 connect to an equalizer module 712. The equalizer module 712 comprises hardware, software, or both configured to perform equalization on the received signal. In one configuration the equalization occurs to reduce intersymbol interference. In one configuration the equalizer module comprises a feedforward filter and decision feedback equalizer. Co-pending patent application, entitled Method and Apparatus for Channel Equalization, by inventor William Jones, which was filed on Jul. 1, 2002, is incorporated in its entirety herein and describes an equalization system as is compatible for use with one or more embodiments of the invention. It is contemplated that any equalizer system or other apparatus configured to generate an accurate decision of the transmitted signal may be utilized. It is contemplated that the equalization module 712 may include a slicer or other decision device and be located or distributed at any point in the receiver.

The output of the equalizer 712 feeds into a de-multiplexer 716. As discussed above, the de-multiplexer 716 is configured to reduce the data rate of a signal by spreading or distributing the signal onto two or more outputs. Hence, conductor 720 comprises a greater number of conductors than is associated with the outputs 718. Hence, output 718 is divided or de-interleaved into conductor 720. The data rate on each conductor in input 720 may be less than the data rate on conductor 718.

The outputs 720 of the de-multiplexer 716 feed into an error correction decoding module (ECdC) 728. In the module 728 there may exist several ECdC sub-modules 732 configured in association with each of the outputs 720 as shown. This provides the advantage of distributing the processing burden of the error correction decoding across numerous subsystems. As a result, high-speed channel throughput may be achieved in a realizable architecture. As shown, the receiver may be configured with M number of ECdC modules 728 M where M is any positive whole number. Thus, the number of ECdC modules 728 is based on the degree of interleaving not the number of physical channels. Any level of expansion is contemplated.

It is contemplated that the error correction decoding is matched to that utilized in an associated transmitter. In one embodiment the ECdC modules 732 are configured to perform continuous trellis decoding. This is in contrast to packet based trellis coding/decoding. As a result, the benefits of continuous trellis decoding are gained. These benefits include but are not limited to a reduction in the total number of symbols that must be sent to fully error correction decode the received signal. In contrast to packet based decoding which requires that additional symbols be sent to terminate the trellis, the continuous trellis decoder embodiment operates on a continuous stream of trellis encoded data and control symbols and does not require that the trellis be terminated at the end of each packet. Continuous trellis decoding is discussed below in more detail.

The ECdC modules 728 output the error corrected signal or data to a multiplexer 734. In one embodiment the multiplexer 734 reverses the effect of the de-multiplexer 716 to assemble the data from the ECdC 728 into a reduced number of conductors. This interleaving process is described above in detail and accordingly is not discussed again. The output of the multiplexer 734 connects to a demapping system 740 which is configured to reverse the effects of mapping that occurred during the transmit processing.

Figure 10:
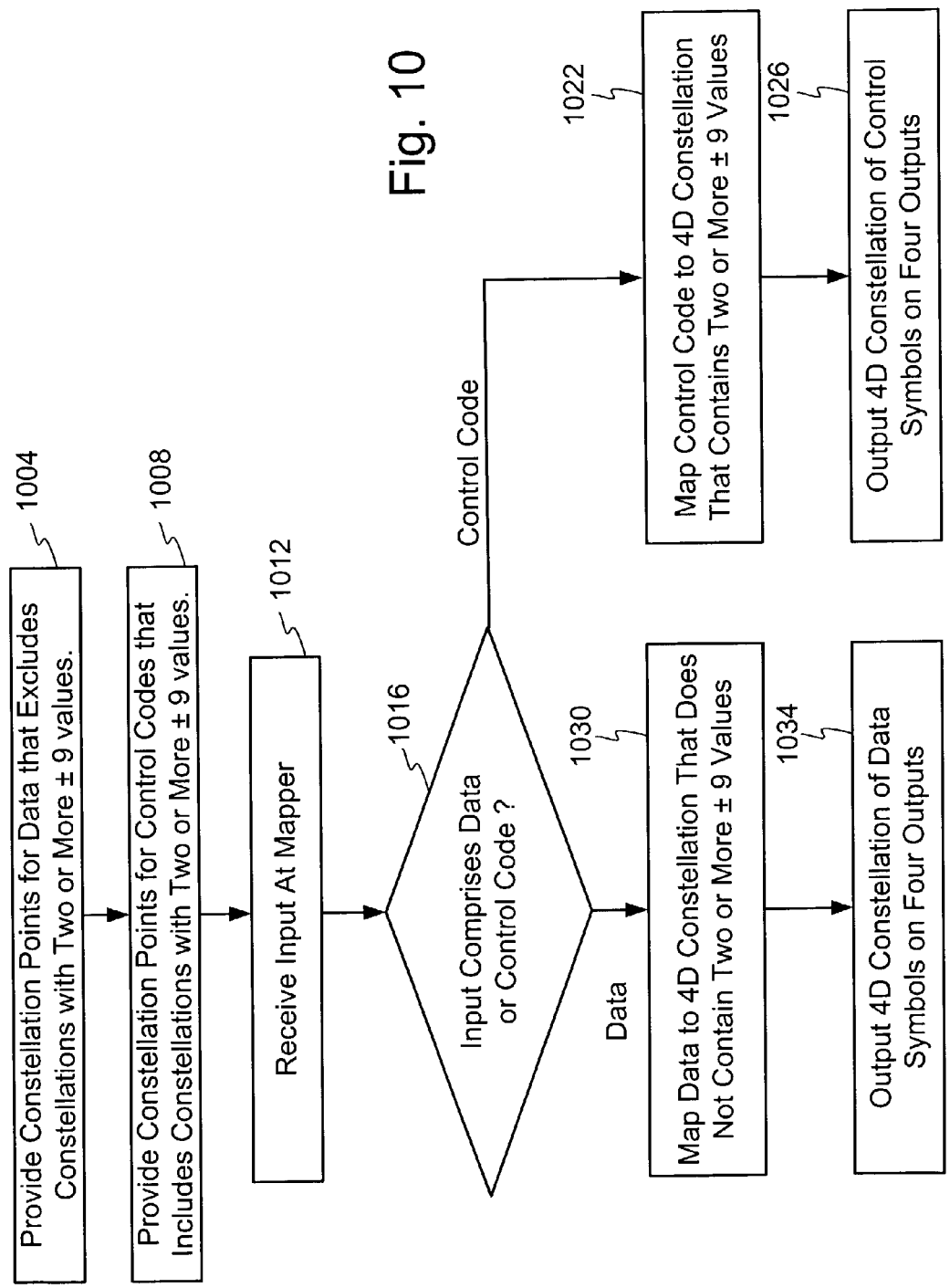
FIG. 10 illustrates an operational flow diagram of an example method of constellation mapping.

In one embodiment the demapping system 740 reverses the effects of 4-D PAM10 mapping. FIG. 10, which is discussed below, illustrates an example method of demapping. In this embodiment the demapping module 740 is configured to remove one or more extra bits that may have been introduced during error correction coding or the mapping operation. For example, the demapping module 740 may drop the parity bit from the trellis encoder. The demapping module 740 may output the signal originally provided to the transmitter prior to transmission. It should be noted that each connection between the various components shown in FIG. 7 may comprise one or more conductors as is determined by the particular specification or design parameters. The output of the demapping module 740 connects to a scrambler 744 to reverse the effects of the scrambler located in the transmitter.

Constellation Shaping

In one embodiment constellation shaping occurs on the data during the mapping process. In general, mapping may occur on the data to realize an increase in the effective data rate. In one embodiment the mapping that occurs is PAM10 (ten level pulse amplitude modulation).

Using a PAM10 modulation or coding scheme the following one dimensional (1D) constellation may be generated:

$$\{-9\ -7\ -5\ -3\ -1\ 1\ 3\ 5\ 7\ 9\}$$

Thus, the transmitted signal, such as its voltage level, could conceivably assume any of these 10 values. Hence, this vector is referred to as a one dimensional 10 point constellation. An example of a four channel system comprises a communication system operating under certain Ethernet standards. Hence, a 4D PAM10 system thus contains $10^4$ or 10,000 constellation points since there exists four channels, each of which may independently carry a signal that assumes any of ten different values.

It is contemplated that any number of bits may be transmitted per baud. In one embodiment 12 bits per of data are combined with an extra bit generated as a result of trellis encoding for a total of 13 bits per baud being transmitted. To transmit the 13 bits per baud requires 8192 constellation points. Subtracting the 8192 required constellation points from the 10,000 total constellation points that are available from 4D PAM10 mapping provides 1808 remaining constellation points not used for data transmission.

In one embodiment of mapping the unused 1808 constellation points are selected for use as control symbols. A control symbol is defined herein to mean any code or output value combination that, in contrast to data, serves as an indicator for system operation. In one embodiment the control symbols are sent by the transmitter and detected by the receiver to control or assist in the transmitter and receiver operation. The control codes may signify any of the following control activities, Start of Packet delimiter (SOP), End of Packet delimiter (EOP), Error (E), Idle (I), Remote Fault (RF), Sequence Ordered Set (SOS) or others as needed.

It is contemplated that any unused symbols, i.e. symbols not designated by the mapper to represent one or more bits of data, may be used to represent one or more control symbols. Selection of which constellation points are available for data and which are available for control symbols may occur to establish the average level of the symbol values reserved for data at zero.

In one embodiment the control symbols are selected from the group of constellations that contain at least two −9 or +9 values or a −9 value and a +9 value. In other embodiments other constellation values may be selected.

Selection of constellations that contain at least two −9 or +9 values or a −9 value and a +9 value in their constellation for use as control symbol identifiers has many advantages over prior art constellation assignment schemes. One advantage is that the selection of these values shape the constellation used for data transmission. As a result of such shaping, transmit level over time is symmetric with respect to a zero level since there are an equal number of constellation points used for data transmission that are greater than zero and less than zero. Thus, there is an equal distribution for symmetric constellation points. In particular, there are 896 data points for each of the values −7, −5, −3, −1, 1, 3, 5, and 7. The 1-dimensional values +9 and −9 have a distribution in a 4D constellation of 512 occurrences each. Thus, removing the constellations having at least two of either or both of −9 or +9 values from those available to represent data provides a symmetric level distribution during data transmission.

Figure 8:
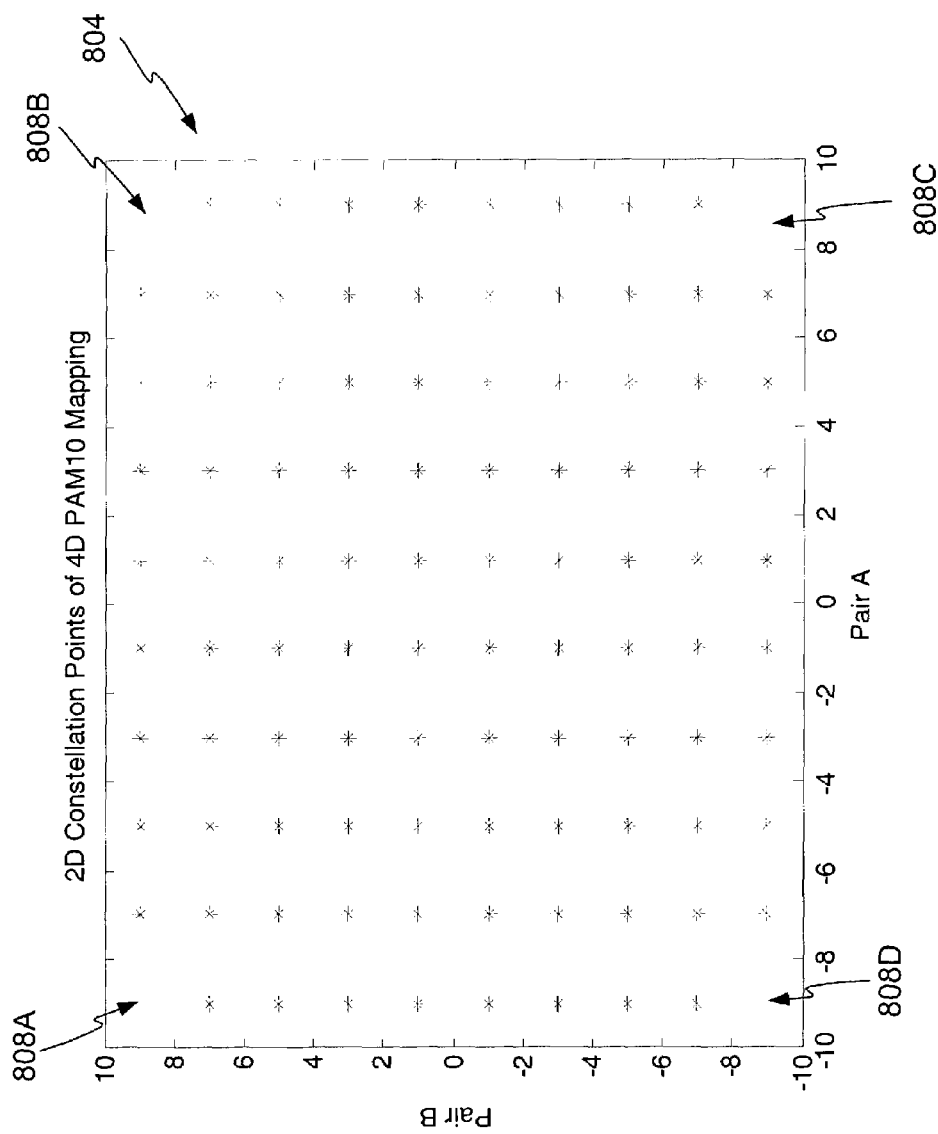
FIG. 8 illustrates an example embodiment of a 2D constellation having data constellation points and control code constellation points.

FIG. 8 illustrates an example embodiment of a 2D constellation wherein constellations with both of either +9 or −9 are reserved for control symbols. The constellation shown in FIG. 8 may be considered a two dimensional slice of a 4D constellation. As shown the corner values 808 (i.e. the −9 and +9 values) of the slice of the 4D constellation are removed from those available for data transmission and are instead reserved for use as control symbols.

The even distribution achieved by such shaping provides the advantage that a system adopting this constellation shaping method will not require an additional data transmit polarity scrambler at the output of a mapper system for the purpose of generating a symmetric transmit signal on average. An additional scrambler is not required because over time the evenly shaped constellation selects level values during the mapping process that evenly distributes the output signal to have a zero level over time. Hence, an additional scrambler component may be eliminated from such a system thereby resulting in lower complexity.

A further advantage is that transmission of symbols may occur with a lower average power since 4D constellations that include two −9 values, two +9 value or both a −9 value and a +9 value are not available during data mapping. While the peak power transmitted remains at the highest mapping value, i.e., +or −9 level in the example embodiment described herein, the overall average power transmitted over time is reduced. This provides the advantage of increasing the distance between transmit levels given a limit on average transmit power thereby leading to an effective increase in signal-to-noise ratio at the receiver.

Yet another advantage is that it allows for continuous trellis coding/decoding where the control symbols may be processed through the error correction coding and hence realize the coding gain resulting from error correction coding. In systems of the prior art, control symbols were not processed through the error correction coding and decoding. As a result, systems of the prior art were more likely to miss an important control code which would disrupt system operation. In one embodiment the control symbols are subject to trellis coding and decoding and thereby receive an approximately 6 dB coding gain.

It is contemplated that in other embodiment the constellation may not be balanced about zero but instead has an average power level of no more than 15% of the maximum constellation value. In such an embodiment the constellation is still close to zero thereby gaining some of the benefits described above. In such an embodiment an additional scrambler may be required or more than mapping constellation may be used to obtain an average transmit level over time of zero.

Figure 9:
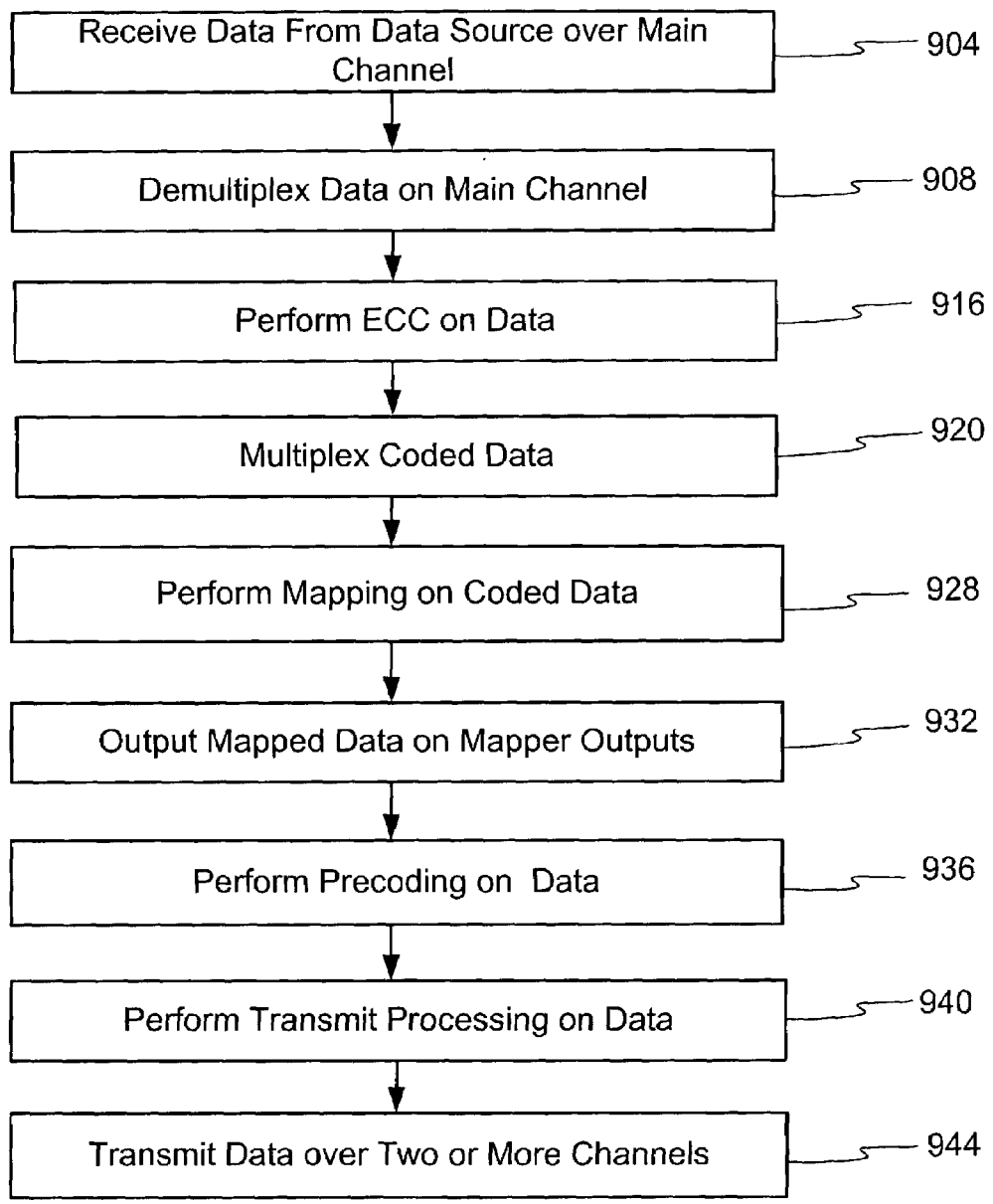
FIG. 9 illustrates an operational flow diagram of an example method of operation of a transmitter.

FIG. 9 illustrates an operational flow diagram of an example method of operation of a transmitter. This is but one example method of operation and it is contemplated other methods of operation may be enabled without departing from the scope of the claims that follow. The following method is directed to a system configured to receive and transmit one or more data streams over two or more channels. It is contemplated that in other embodiments any number of data streams may be transmitted over any number of channels.

In reference to FIG. 9 and at a step 904, the system receives a full rate data stream from a data source. In one embodiment the full data rate is too high for successful transmission of the data to a remote location over a single physical channel. For example, in one embodiment the transmitter system described herein receives an incoming data stream comprised of 12 bit words from a data source at a rate of 10/12 GHz. In the example environment of twisted pair copper, this data rate may not be transmitted over a single twisted pair channel. As a result, at a step 908, the system de-multiplexes the full rate data stream into two or more fractional rate data streams. As a result of the de-multiplexing of step 908, the data rate on each of the de-multiplexer outputs is reduced as compared to the de-multiplexer input. In one embodiment the system de-multiplexes the data into four fractional rate data streams, each of which comprises a 12 bit wide path carrying data at a rate of 10/48 GHz.

Thereafter, at a step 916 the transmit system may perform error correction coding on the data on each of the fractional rate data streams. In one embodiment the error correction coding comprises 8-state Ungerboeck trellis coded modulation. In other embodiments trellis coding, convolutional encoding, block coding, or product coding may be performed. In one embodiment the error correction coding generates a 13 bit word that is output from the error correction encoder at a rate of 10/48 GHz.

After encoding, the data is provided as an input into a multiplexer. At this stage the data may be referred to as one or more fractional rate encoded data streams. The multiplexer selectively interleaves or arranges the symbols into one or more full rate encoded data streams. This occurs at a step 920. In one embodiment the multiplexer receives a first number of data streams and as a result of the interleaving outputs a second number data streams, wherein the first number is greater than the second number. In one embodiment the output from multiplexer is 13-bits wide and operates at a data rate of 10/12 GHz.

At a step 928 a mapper performs mapping on the encoded data. While any form of mapping may occur, in one embodiment 4-dimensional (4D) pulse amplitude modulation type mapping (PAM) occurs on the full rate encoded data. In one embodiment ten level PAM mapping may occur. At a step 932, the mapped data is output from the one or more mapping modules as symbol values. As is contemplated with multidimensional mapping, each mapping module includes two or more outputs. In one embodiment configured with 4D mapping each mapping module generates 4 outputs. In one embodiment each mapper receives a single multi-bit wide input during a clock cycle and outputs four symbols during a clock cycle. In one embodiment the outputs operate at a data rate of 10/12 GHz. Certain aspects of mapper operation are discussed below in more detail on conjunction with FIG. 10.

At a step 936 the transmitter may perform preceding. Precoding may be performed to reduce the unwanted effects of intersymbol interference on the signal. At a step 940 additional transmit processing may occur on the data.

Thereafter, at a step 944 the data, represented as symbols, is transmitted over the two or more paths. Although described herein in terms of twisted pair conductors and channels, it is contemplated that any medium may be utilized, including but not limited to, optical, and wireless, such as radio or other frequency. It is contemplated that a path, such as a twisted copper pair channel, corresponds to each channel over which data is transmitted. In one embodiment, the transmit rate on each of the channel is 10/12 GHz. In one embodiment, there exist four transmission lines, each of which comprises a pair of twisted copper conductors. An example of such a line is category 5 UTP cabling compatible with the Ethernet 1000BASE-T standard. In other embodiments any other communication channel may be utilized, including but not limited to one or more, wireless channels, any electrically conductive channels, fiber optics or fiber optic cables, optical channels, twisted pair conductors, coaxial cabling, or any other type of channels as may be contemplated by one of ordinary skill in the art.

FIG. 10 illustrates an operational flow diagram of an example method of constellation mapping. One exemplary type of mapping comprises pulse amplitude modulation (PAM) mapping wherein one or more bits of data are mapped into a single signal level, such as a voltage level. One exemplary type of PAM mapping comprises PAM10 mapping wherein a number of bits are mapped into one of ten predetermined levels. It is further contemplated that PAM mapping may occur over more than one dimension. Accordingly a four dimensional constellation may be created wherein each dimension of the constellation may be selected from the available PAM values. FIG. 8 illustrates a two dimensional PAM10 constellation.

As an advantage of the method and apparatus described herein, the number of available constellation points is greater than the number of possible 4D symbol combinations used to represent data that must be assigned constellation points. In one embodiment the extra available constellation points are available and utilized to represent control codes.

Turning now to FIG. 10, an example method of mapping control codes is shown. In the embodiment shown in FIG. 10 the mapper is provided or constructed with a constellation mapping scheme with sufficient constellation points to map all possible symbol values that represent data values while also having additional constellation points to represent control codes. The term constellation is used herein to mean a collection of symbol values. Thus, constellation may comprise the collection of symbol values, or may be expanded to multiple dimensions, or comprise only the selection of symbol values chosen to be transmitted during a transmit opportunity.

In one embodiment the constellation mapping scheme for data values excludes from use those 4D constellations reserved for control codes. For example, a PAM10 constellation may comprise the values −9, −7, −5, −3, −1, 1, 3, 5, 7, and 9. In one embodiment step 1004 excludes from the set of constellation points available for representing data the constellations containing two or more ±9 values. It is contemplated that the mapping scheme is known by the receiver and the transmitter and may be hardwired or programmed during an initialization phase or during manufacture.

At a step 1008 the mapper is provided an assignment scheme for mapping of control codes. In one embodiment the control code assignment scheme assigns control codes to four dimensional constellation values that include two or more ±9 values. Thus, these four dimensional constellations are reserved for control codes.

At a step 1012 the mapper receives an input. In one embodiment the input comprises a 13 bit word that is mapped into a four dimensional PAM10 constellation. In such an embodiment the mapper may include four outputs each of which carry a PAM10 value during an output event, such as a clock cycle.

After receiving the input, the mapping module determines if the received input (binary data) comprises data or a control code. This occurs at a step 1016. In one embodiment a look-up operation occurs during the mapping processes. In another embodiment an algorithmic operation is executed as part of the mapping or demapping process. In one embodiment the control code arrives at the mapper as two or more binary bits.

If the input comprises a control code then the operation advances to a step 1022 wherein the mapper maps the control code into a four dimensional constellation comprised of constellation points or symbol values that are reserved for control codes. In one embodiment this comprises constellation points that contain two or more ±9 values. After mapping, the mapper operation advances to a step 1026 and outputs the four dimensional constellation as symbols on four outputs. It is contemplated that the receiver be provided with the mapping scheme so that upon reception and demapping of a constellation, the receiver is thus able to determined that the received constellation is a control code. At the receiver appropriate interpretation and processing of the control code may occur.

Alternatively, if at step 1016 the input is interpreted to be data then the operation advances to a step 1030 and the mapper maps the data into an appropriate constellation. In one embodiment this may comprise a look-up operation. In one embodiment the mapping comprises mapping the data into a constellation selected from a group of constellations that have an average level of zero. In such an embodiment the constellation values have been selected or shaped to have an average level or value of zero thereby eliminating the need for a second scrambler on the channel side of the mapper. Further, a lower overall transmit power may result of the maximum constellation values being reserved for the less often occurring control codes.

In one embodiment a four dimensional constellation is selected that does not contain two or more ±9 values. It is contemplated that these constellations are reserved for control symbols. Next, at a step 1034 the mapper outputs the four dimensional constellation of data symbols on four outputs. It should be noted that a four dimensional constellation size is selected for purposes of discussion and not limitation. Any size or dimension of constellation and any type of modulation or mapping may be selected.

An advantage to the method discussed in FIG. 10 is that in one embodiment constellation shaping is utilized to construct the constellation points available for data representation to desirably establish symmetry or balance in the constellation. The symmetry may be between control code constellation points and data constellation points, or the average value of the data constellation points, or both. As a result of such symmetry or balance, mapping binary data into the constellations designated for data results in a symmetric distribution around a zero level. Thus, during transmission the average transmit level over time would be zero or close to zero. As a result, an output scrambler on the transmission line side of the mapper is unnecessary.

Figure 11:
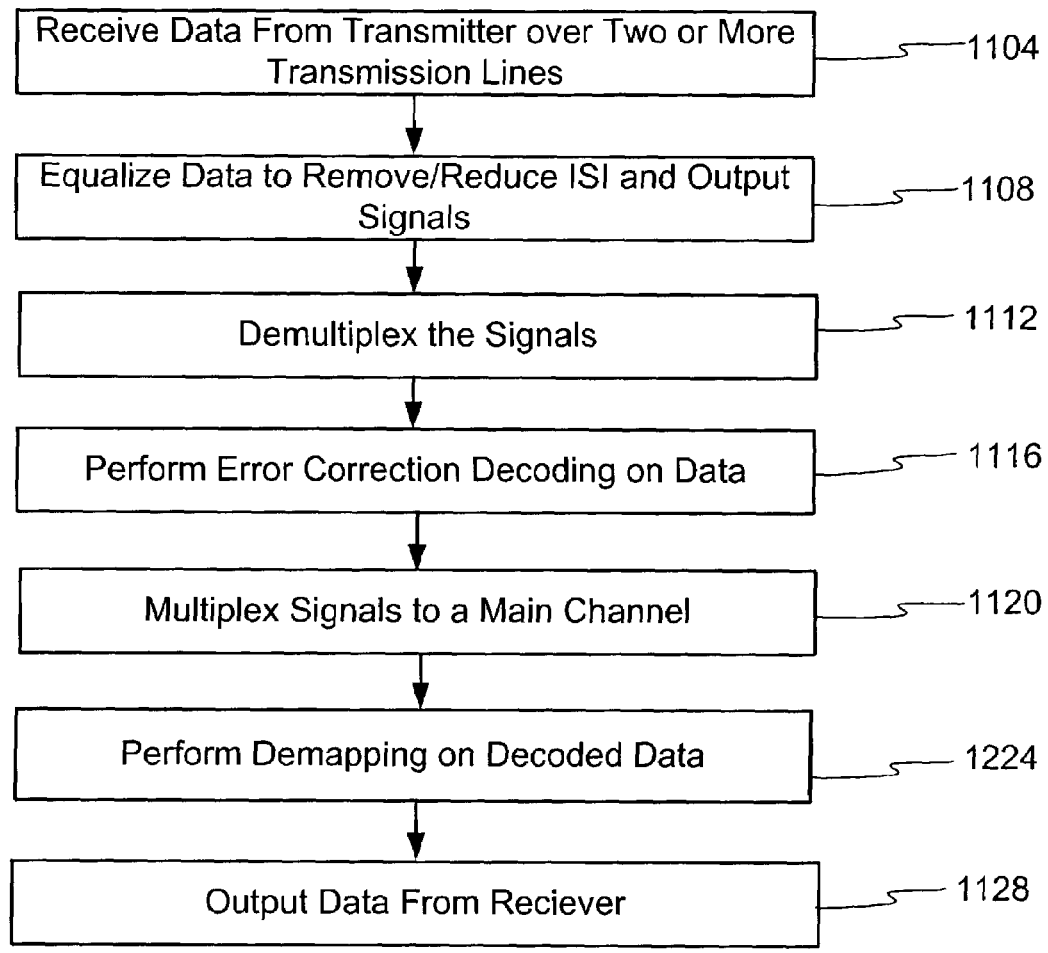
FIG. 11 illustrates an operational flow diagram of an example method of operation of a receiver.

FIG. 11 illustrates an operational flow diagram of an example method of operation of a receiver. This is but one example embodiment of the invention and as such the claims should not be considered as being limited to this particular method of operation. At a step 1104 a receiver receives an input over two or more channels. Thereafter, at a step 1108, the receiver equalizes the received input to remove or reduce unwanted intersymbol interference. The output from the equalizer system may be considered to be a full rate modulated symbol stream. In one embodiment the receiver includes four equalizer systems, each of which output a PAM10 symbol during each clock cycle, at a rate of 10/12 GHz.

After equalization the signals are provided to a de-multiplexer. The de-multiplexer separates the signals into fractional rate symbol stream. This occurs at a step 1112. As a result the data rate in each data stream is less than prior to de-multiplexing. This facilitates parallel processing of high rate data streams. In one embodiment the multiplexer outputs sixteen signals each of which comprise a symbol value, such as a PAM10 signal at a data rate of 10/48 GHz.

At a step 1116 the receiver performs error correction decoding on the signals output from the multiplexer to create one or more fractional rate decoded symbol streams. As is understood by one of ordinary skill in the art, the type of error correction decoding is linked to the type of error correction encoding performed at the transmitter.

At a step 1120 the system multiplexes, i.e. interleaves, the symbol streams to a one or more full rate symbol streams. At a step 1124 demapping is performed on the symbols. The demapping reverses the effects of mapping performed at a transmitter. In one embodiment, not shown, the receiver includes four demapping modules each of which are configured to receive four inputs and output a single output. In one embodiment the output is 12 bits wide and operates at a rate of 10/12 GHz. In one embodiment the output is 13 bits wide and operates at a rate of 10/12 GHz. As discussed in conjunction with FIG. 10, control codes may be culled or identified in the mapper. It is contemplated that specialized processing may occur when a control code is demapped. At a step 1128, the data is output from the receiver.

EXAMPLE IMPLEMENTATION

Figure 12:
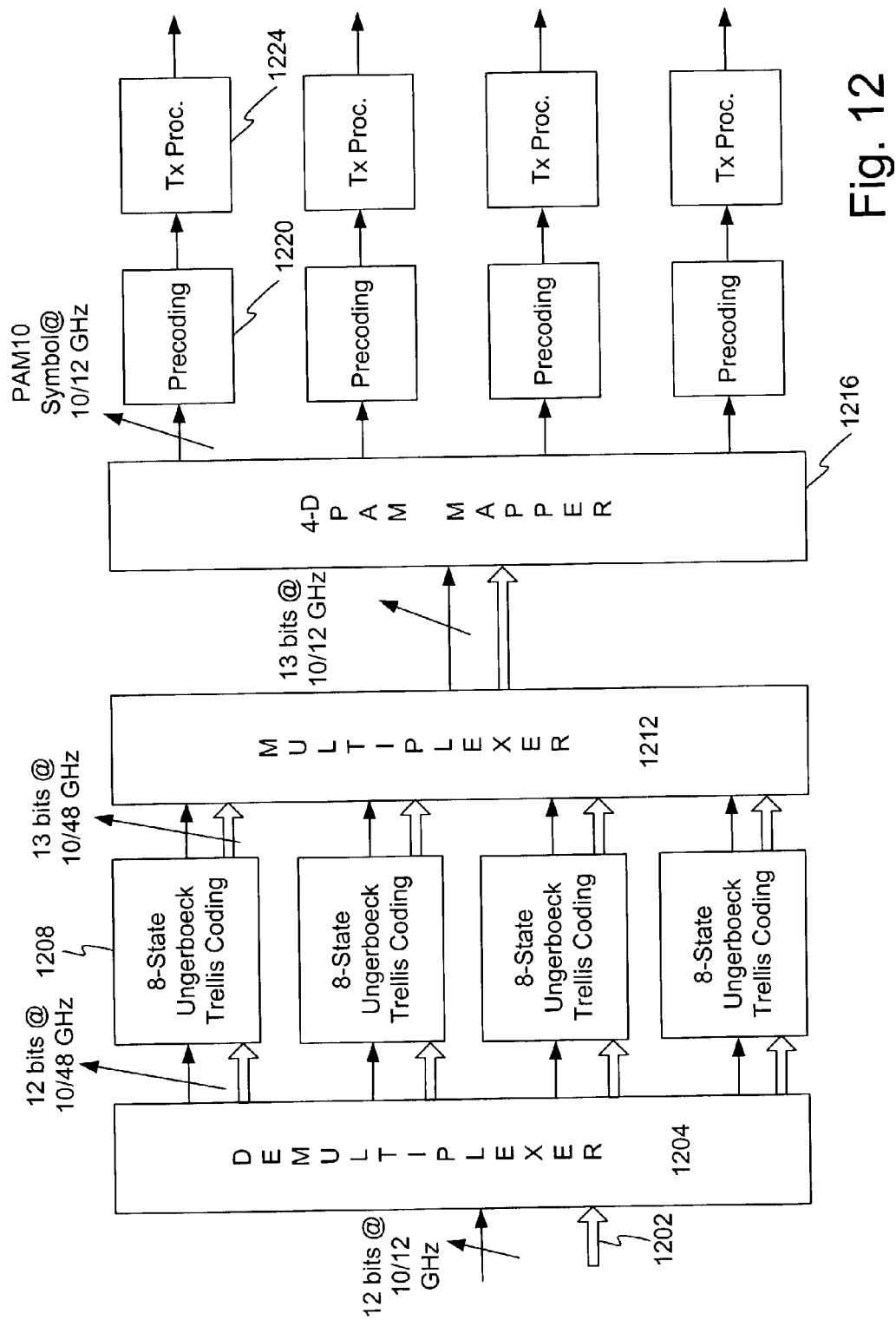
FIG. 12 illustrates a block diagram of an example implementation of a transmitter.

FIG. 12 illustrates a block diagram of an example implementation of a receiver. This implementation example is provided for purposes of understanding and not limitation. In one exemplary embodiment the full rate input data stream provided to the de-multiplexer 1204 is a twelve bit wide word presented at a rate of 10/12 GHz. The data/control type input 1202 is also shown. The term control type is defined to mean a value that indicates whether the current input is a control symbol and, if so, uniquely identifies the type of control word at the input. The de-multiplexer 1204 output is a fractional rate data stream and in this implementation example comprises 4 sets of twelve bit words at a rate of 10/48 GHz. This data stream is provided as an input to 4 forward error correction (FEC) encoders 1208 that comprises an 8-state Ungerboeck trellis encoder 1208. The output of the encoder 1208 comprises a fractional rate encoded data stream.

In the implementation example discussed herein, the selection of FEC is a tradeoff of implementation complexity versus the desired coding gain. At a baud rate of 10/12 GHz it is desirable to obtain a low complexity implementation. As described above, the 4D 8-state Ungerboeck trellis code is selected as a baseline code. When presented with additive white gaussian noise (AWGN), this FEC code on 10 PAM achieves a coding gain of about 3.5 dB over PAM8. In addition, shaping gain of about 0.64 dB may be realized by using the described constellation shaping.

The 4D 8-state Ungerboeck code is sensitive to error propagation from the DFE and noise correlation created by the forward equalization and channel shortening equalization. In the implementation example discussed herein 4D coding across pairs was selected and the trellis coding was 4-way interleaved across time. This reduced the complexity of the design so that 4 trellis decoders operating at ¼ the clock rate were utilized. In addition, the 4-way time interleaving of the trellis code prevents bursts of error from hampering trellis code operation. A burst of errors is thus spread out across four time interleaves of trellis coding and subject to FEC decoding in different decoders.

In the example implementation of FIG. 12, the 4-way time interleaved trellis coded modulation occurs by coding in 4 dimensions across the pairs using the 8-state Ungerboeck trellis code and introducing a four-way time interleave to reduce the decoder clock rate and reduce the sensitivity of the FEC to decision feedback equalizer (DFE) error propagation and noise correlation. Thus, the four trellis decoders operate at the ¼ baud rate of 10/48 GHz and achieve the desired coding gain.

The 8-state Ungerboeck trellis encoder 1208 outputs a thirteen bit wide word at a rate of 10/48 GHz into a multiplexer 1212. The 4 sets of inputs to the multiplexer 1212 at 10/48 GHz are interleaved to become a full rate encoded data stream comprising 13 bits at 10/12 GHz. The output of the multiplexer 1212 feeds into a 4-D PAM10 mapper 1216. The output of the mapper 1216 comprises one or more full rate modulated symbol streams.

As can be understood, the selection of the number of PAM levels, the baud rate, and the forward error correction (FEC) coding are all interrelated. In the implementation example described herein the channel capacity is maximized by using a baud rate of around 800 MHz.

The implementation example provided herein also includes constellation shaping. Given a selection of four pairs with PAM10 line decoding, the 4D constellation has 10×10×10×10=10,000 constellation points. The twelve bit data word has 4096 distinct values and the thirteen-bit trellis encoded word has 8192 distinct points. The PAM10 mapping results in the thirteen-bit word being mapped into one of 8192 possible constellation points. Therefore, there exist 1808 redundant points, some of which are used for control symbols.

The implementation example obtains some shaping gain by eliminating the constellation points with the largest transmit power. In this example, the +9 and −9 symbols have the largest transmit power in any single dimension and there are exactly 1808 4D constellation points that contain any combination of two or more +9's and/or −9's. Therefore, the shaping eliminates from the normal data mapping any point that contains one of these combinations. The remaining points are uniquely mapped to the remaining constellation points using any manner known in the art. In one embodiment an algorithmic equation is utilized during the mapping process. In this embodiment the rate of occurrence for a +9 or −9 on any given pair is 4/7 the rate of any other levels.

Precoding and transmit processing 1220, 1224 may occur as known in the art to facilitate transmission over four twisted pair conductors. In this implementation example, transmission of the PAM10 symbols occurs over the four twisted pair conductors at a rate of 10/12 GHz.

Figure 13:
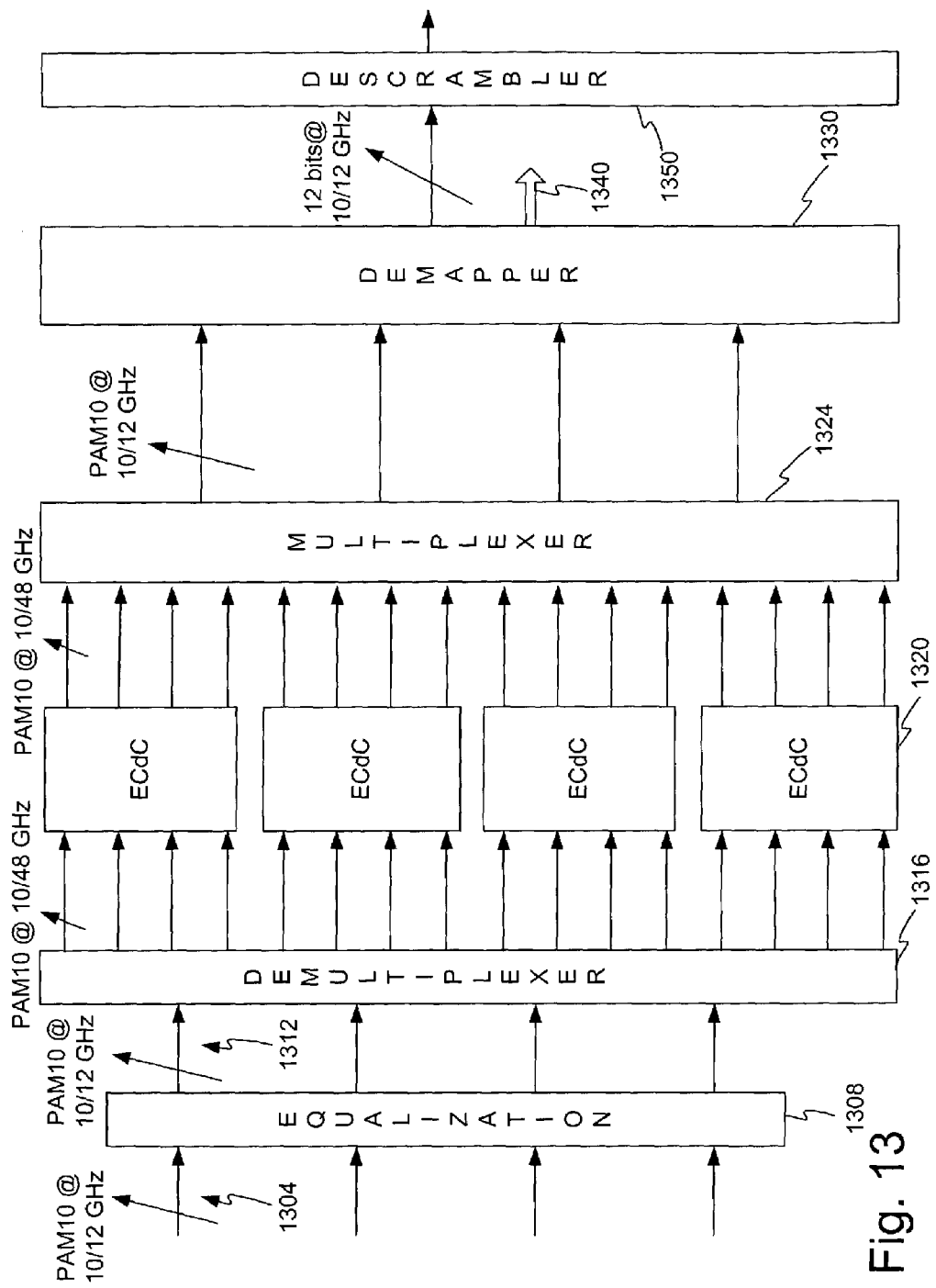
FIG. 13 illustrates a block diagram of an example implementation of a receiver.

FIG. 13 illustrates a block diagram of an example implementation of a receiver. This implementation example is provided for purposes of understanding not limitation. Channel outputs 1304 connect to an equalization system 1308. The channel outputs 1304 carry PAM10 symbols corrupted by noise, ISI, and crosstalk at a rate of 10/12 GHz. In this implementation example, the equalization system 1308 reduces intersymbol interference (ISI) and outputs PAM10 symbols in the form of full rate equalized symbol stream on conductors 1312 at a rate of 10/12 GHz symbols per second to a de-multiplexer 1316. Some ISI, noise and crosstalk may remain in the signal. In this implementation example, for each input carrying full rate equalized symbol streams, such as input 1312, the de-multiplexer 1316 has four outputs carrying fractional rate equalized symbol streams. These fractional rate equalized symbol streams connect to error correction decoding modules 1320 such that each fractional rate equalized symbol stream provides PAM10 signals at a rate of 10/48 GHz to the error correction decoding modules. When considered in a group of four, the fractional rate equalized symbol stream may be referred to as a fractional rate equalized 4-D symbol stream. The error correction decoding modules 1320 perform error correction decoding to determine and eliminate error that may have been introduced during the equalization process. In the embodiment shown in FIG. 13, 8-state Ungerboeck trellis coding decoding is performed. Four error correction decoding modules 1320 output the PAM10 fractional rate decoded symbol stream at a rate of 10/48 GHz into a multiplexer 1324. The four outputs from the multiplexer 1324 comprise a 4D PAM10 full rate decoded symbol stream operating at a data rate of 10/12 GHz and feed into a demapping module 1330. The demapping module 1330 reverses the effects of 4D PAM10 mapping by translating the symbols into a corresponding string of bits. The output of the demapping module comprises a full rate demodulated data stream and the data/control code type 1340. In one embodiment this full rate demodulated data stream is output on a 12 bit wide conductor at a data rate of 10/48 GHz. The full rate demodulated data stream may be provided to a de-scrambler 1350.

While various embodiments and implementation examples of the invention have been described, it will be apparent to those of ordinary skill in the art that many more embodiments and implementations are possible that are within the scope of this invention.

What is claimed is:

1. A communication system for transmitting data over two or more channels comprising:
 a de-multiplexer configured to receive a first number of data streams from a data source and output a second number of data streams, wherein the second number is greater than the first number;
 one or more error correction encoders configured to receive the second number of data streams and perform encoding on the second number of data streams to create encoded data;
 a multiplexer configured to process the encoded data from the one or more error correction encoders and output encoded data in a third number of data streams; and
 one or more mapping modules configured to receive encoded data in the third number of data streams from the multiplexer and generate symbol values representative of encoded data in the third number of data streams, the symbol values selected from a constellation of available symbol values.

2. The system of claim 1, further including one or more precoders configured to receive the symbol values and process the symbol values to at least partially compensate for the effects of transmission through a channel.

3. The system of claim 2, further including two or more transmit processing modules configured to transmit the symbol values through two or more transmission lines.

4. The system of claim 1, wherein the one or more mapping modules comprise mapping modules configured to perform PAM10 mapping on the data.

5. The system of claim 1, wherein the constellation of available symbol values comprises a constellation of 10,000 data points, 8192 of which are reserved to represent data.

6. The system of claim 1, wherein the one or more error correction encoders comprise 8-state Ungerboeck trellis encoders.

7. The system of claim 1, wherein the one or more mapping modules map the data into symbol values selected from a constellation of symbol values that have an average level of zero.

8. A method of processing data prior to transmission over two or more channels to increase the data transmission rate, the method comprising:
 receiving a first data stream from a data source;
 demultiplexing the first data stream into two or more second data streams;
 performing error correction encoding on the two or more second data streams to create two or more encoded data streams;
 multiplexing the two or more encoded data streams to create interleaved encoded data streams wherein the number of interleaved encoded data streams is less than the number of encoded data streams; and
 modulating the interleaved encoded data streams to convert the interleaved encoded data streams into symbol values on two or more modulator outputs.

9. The method of claim 8, wherein the error correction encoding comprises trellis encoding and the modulating comprises modulating the two or more encoded data streams using ten level pulse amplitude modulation.

10. The method of claim 8, wherein the interleaved encoded data stream is comprised of control codes and data and the modulating translates the data and control codes into symbol values.

11. The method of claim 10, wherein the symbol values that represent data have an average level of zero.

12. The method of claim 8, wherein the modulating comprises ten value pulse amplitude modulation.

13. A communication system for processing at least one signal received over two or more channels comprising:
 one or more equalizers configured to receive at least one signal from the two or more channels and process the at least one signal to reduce the effects of transmission through the two or more channels;
 a de-multiplexer configured to receive the at least one signal from the one or more equalizers on a first number of inputs and output at least two signals on a second number of outputs, wherein the second number is greater than the first number;
 one or more error correction decoders configured perform decoding on the at least two of the said second number of outputs creating at least two decoded signals;

a multiplexer configured to combine the at least two decoded signals into at least one output decoded signal; and one or more demapping modules configured to translate the at least one output decoded signal to data.

14. The system of claim 13, wherein the de-multiplexer converts four signals into sixteen signals and the multiplexer converts sixteen signals into four signals and wherein the two or more channels comprises four channels, each consisting of two conductors.

15. The system of claim 13, wherein the one or more error correction decoders are configured to decode 8-state Ungerboeck trellis encoded data.

16. The system of claim 13, wherein the one or more demapping modules are configured to map 4D PAM10 symbols into data and control symbols.

17. The system of claim 13, wherein the at least one signal comprises PAM10 symbols.

18. The system of claim 13, wherein the one or more equalizers comprise a feedforward equalizer and a feedback equalizer.

19. A method for processing signals received at a first data rate comprising:

receiving two or more signals via two or more channels;

filtering the two or more signals to reduce the effects of intersymbol interference;

de-interleaving the two or more signals to create three or more signals at a second data rate;

error correction processing the three or more signals to correct errors arising during transmission to create three or more error corrected signals;

interleaving the three or more error corrected signals two or more interleaved signals at a third data rate;

demodulating the two or more interleaved signals to convert the two or more interleaved signals to data.

20. The method of claim 19, wherein the second data rate is lower than the first data rate and the third data rate is higher than the second data rate.

21. The method of claim 19, wherein the signal comprises symbol values and demodulating comprises converting at least one symbol value to data.

22. The method of claim 19, wherein the demodulating comprises mapping the two or more signals to data and control codes.

23. The method of claim 22, wherein the signal comprises a symbol value and the demodulating comprises comparing the two or more signals to a constellation of symbol values to determine if the two or more signals comprise data or a control code.

24. The method of claim 23, wherein the signal comprises ten level pulse amplitude modulated symbol values.

25. A system for achieving data communication between a first location and a second location comprising:

a transmitter comprising:

means for receiving a full rate data stream;

means for time de-interleaving the full rate data stream into two or more fractional rate data streams;

means for performing error correction coding on the two or more fractional rate data streams to create two or more fractional rate encoded data streams;

means for time interleaving the two or more fractional rate encoded data streams into a full rate encoded data stream;

means for mapping the full rate encoded data stream into symbol values;

means for precoding the symbol values;

means for transmitting the precoded symbol values to second location;

a receiver at the second location, configured to receive the precoded symbol values, comprising;

means for filtering the precoded symbol values to compensate for the effects of transmitting to a second location to create a full rate filtered symbol stream;

means for time de-interleaving the full rate filtered symbol values to create a fractional rate filtered symbol stream;

means for decoding the fractional rate filtered symbol stream to create fractional rate decoded symbol stream;

means for time interleaving the fractional rate decoded symbol stream to create full rate decoded symbol stream;

means for demapping the full rate decoded symbol stream to create a full rate demodulated data stream.

26. The system of claim 25, wherein the means for mapping comprises means for mapping the coded data into symbol values reserved for data, wherein the symbol values reserved for data have an average value of zero.

27. The system of claim 26, wherein the symbol values reserved for data comprise 8192 symbol values.

28. The system of claim 25, wherein the error correction coding comprises eight-state Ungerboeck trellis coding and the mapping comprises ten level pulse amplitude modulation.

* * * * *

UNITED STATES PATENT AND TRADEMARK OFFICE
CERTIFICATE OF CORRECTION

PATENT NO. : 7,133,425 B2
APPLICATION NO. : 10/194775
DATED : November 7, 2006
INVENTOR(S) : Brett Anthony McClellan It is certified that error appears in the above-identified patent and that said Letters Patent is hereby corrected as shown below:

Column 2, line 24, delete "preceding" and insert --precoding--.

Column 2, line 25, delete "preceding" and insert --precoding--.

Column 2, line 26, delete "preceding" and insert --precoding--.

Column 2, line 30, delete "preceding" and insert --precoding--.

Column 9, line 40, delete "preceding" and insert --precoding--.

Column 10, line 19, delete the word "to".

Column 13, line 46, delete "+or" and insert --+ or--

Column 15, line 4, delete "preceding" and insert --precoding--.

Signed and Sealed this

Sixth Day of February, 2007

JON W. DUDAS
*Director of the United States Patent and Trademark Office*